United States Patent
Kim et al.

(10) Patent No.: US 11,037,988 B2
(45) Date of Patent: Jun. 15, 2021

(54) SEMICONDUCTOR DEVICE

(71) Applicant: SAMSUNG ELECTRONICS CO., LTD., Suwon-si (KR)

(72) Inventors: Jong Uk Kim, Yongin-si (KR); Jeong Hee Park, Hwaseong-si (KR); Seong Geon Park, Seongnam-si (KR); Soon Oh Park, Suwon-si (KR); Jung Moo Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/802,976

(22) Filed: Feb. 27, 2020

(65) Prior Publication Data
US 2020/0194500 A1    Jun. 18, 2020

Related U.S. Application Data

(63) Continuation of application No. 16/018,333, filed on Jun. 26, 2018, now abandoned.

(30) Foreign Application Priority Data

Jul. 6, 2017  (KR) .................. 10-2017-0085702

(51) Int. Cl.
*H01L 27/24* (2006.01)
*H01L 45/00* (2006.01)
(Continued)

(52) U.S. Cl.
CPC ...... *H01L 27/2463* (2013.01); *H01L 27/2427* (2013.01); *H01L 27/2481* (2013.01); *H01L 45/06* (2013.01); *H01L 45/126* (2013.01); *H01L 45/1233* (2013.01); *H01L 45/142* (2013.01); *H01L 45/143* (2013.01); *H01L 45/144* (2013.01); *H01L 45/148* (2013.01);
(Continued)

(58) Field of Classification Search
CPC . H01L 27/2463; H01L 27/2481; H01L 45/06; H01L 45/1233; H01L 45/126; H01L 45/142; H01L 45/143; H01L 45/144; H01L 45/148; H01L 45/1675
See application file for complete search history.

(56) References Cited

U.S. PATENT DOCUMENTS 6,613,693 B1 *  9/2003  Heo ................. H01L 21/31111
                                                    257/E21.251
8,158,966 B2    4/2012  Rho et al.
(Continued)

FOREIGN PATENT DOCUMENTS

JP  2009-049254 A  3/2009
KR  10-0675278 A   1/2007
(Continued)

*Primary Examiner* — Mohammed Shamsuzzaman
(74) *Attorney, Agent, or Firm* — Lee IP Law, P.C.

(57) ABSTRACT

A semiconductor device includes a first memory cell, a second memory cell, a first capping film, and a second capping film. The first memory cell includes a first ovonic threshold switch (OTS) on a first phase change memory. The second memory cell includes a second OTS on a second phase change memory. The first capping film is on side surfaces of the first and second memory cells. The second capping film is on the first capping film and fills a space between the first and second memory cells.

7 Claims, 21 Drawing Sheets

(51) Int. Cl.
  *G11C 7/18* (2006.01)
  *G11C 13/00* (2006.01)
  *G11C 8/14* (2006.01)

(52) U.S. Cl.
  CPC ............ H01L 45/1675 (2013.01); *G11C 7/18* (2013.01); *G11C 8/14* (2013.01); *G11C 13/003* (2013.01); *G11C 13/0004* (2013.01); *G11C 2213/76* (2013.01)

(56) References Cited

U.S. PATENT DOCUMENTS

| | | |
|---|---|---|
| 8,482,953 B2 | 7/2013 | Noshiro |
| 8,796,814 B2 | 8/2014 | Ogihara |
| 9,013,045 B2 | 4/2015 | Satoh et al. |
| 9,299,747 B1 | 3/2016 | Pellizzer et al. |
| 9,515,250 B2 | 12/2016 | Ha |
| 2007/0235710 A1 | 10/2007 | Matsuzaki et al. |
| 2015/0171321 A1* | 6/2015 | Chan .................. H01L 27/2481 257/4 |
| 2016/0133671 A1* | 5/2016 | Fantini ................ H01L 27/2427 257/4 |
| 2018/0159032 A1* | 6/2018 | Park .................... H01L 45/1293 |
| 2018/0315474 A1* | 11/2018 | Redaelli ............. G11C 13/0069 |

FOREIGN PATENT DOCUMENTS

| | | |
|---|---|---|
| KR | 10-2011-0072024 A | 6/2011 |
| KR | 10-2015-0129871 A | 12/2015 |

\* cited by examiner

US 11,037,988 B2

SEMICONDUCTOR DEVICE

CROSS-REFERENCE TO RELATED APPLICATION

This is a continuation of U.S. patent application Ser. No. 16/018,333 filed on Jun. 26, 2018, and entitled "Semiconductor Device and Method for Fabricating the Same," the entire contents of which are hereby incorporated by reference.

Korean Patent Application No. 10-2017-0085702 filed on Jul. 6, 2017, and entitled, "Semiconductor Device and Method for Fabricating the Same," is incorporated by reference herein in its entirety.

BACKGROUND

1. Field

One or more embodiments described herein relate to a semiconductor device and a method for fabricating a semiconductor device.

2. Description of the Related Art

Volatile semiconductor memory devices lose stored information when power is turned off. Nonvolatile semiconductor memory devices retain stored information when power is turned off. Examples of nonvolatile memory devices include a flash memory device and a phase change memory device.

SUMMARY

In accordance with one or more embodiments, a semiconductor device includes a first memory cell extending in a first direction and including a first phase change memory and a first ovonic threshold switch (OTS) on the first phase change memory; a second memory cell extending in the first direction and including a second phase change memory and a second OTS on the second phase change memory, the second memory cell spaced apart from the first memory cell in a second direction intersecting the first direction; a first capping film on side surfaces of the first and second memory cells; and a second capping film on the first capping film and filling a space between the first and second memory cells.

In accordance with one or more other embodiments, a semiconductor device includes a first word line extending in a first direction; a first bit line extending in a second direction intersecting the first direction, the first bit line spaced apart from the first word line in a third direction intersecting the first and second directions; a first memory cell extending in the third direction between the first word line and the first bit line, the first memory cell including a first phase change memory and a first OTS which are sequentially stacked, a first capping film surrounding a side surface of the first memory cell; and a second capping film on an outer side surface of the first capping film and filling a space between the first bit line and the first word line.

In accordance with one or more other embodiments, a semiconductor device includes a first word line extending in a first direction; a second word line extending in the first direction and in parallel with the first word line on the first word line; a first bit line extending in a second direction intersecting the first direction, the first bit line between the first and second word lines; a first memory cell in a vertical direction between the first word line and the first bit line, the first memory cell including a first phase change memory and a first OTS which are sequentially stacked; a second memory cell in a vertical direction between the second word line and the first bit line, the second memory cell including a second phase change memory and a second OTS which are sequentially stacked; a first capping film surrounding a side surface of the first memory cell; a second capping film surrounding a side surface of the second memory cell; a third capping film formed on the first capping film to fill a space between the first bit line and the first word line; and a fourth capping film formed on the second capping film to fill a space between the first bit line and the second word line.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
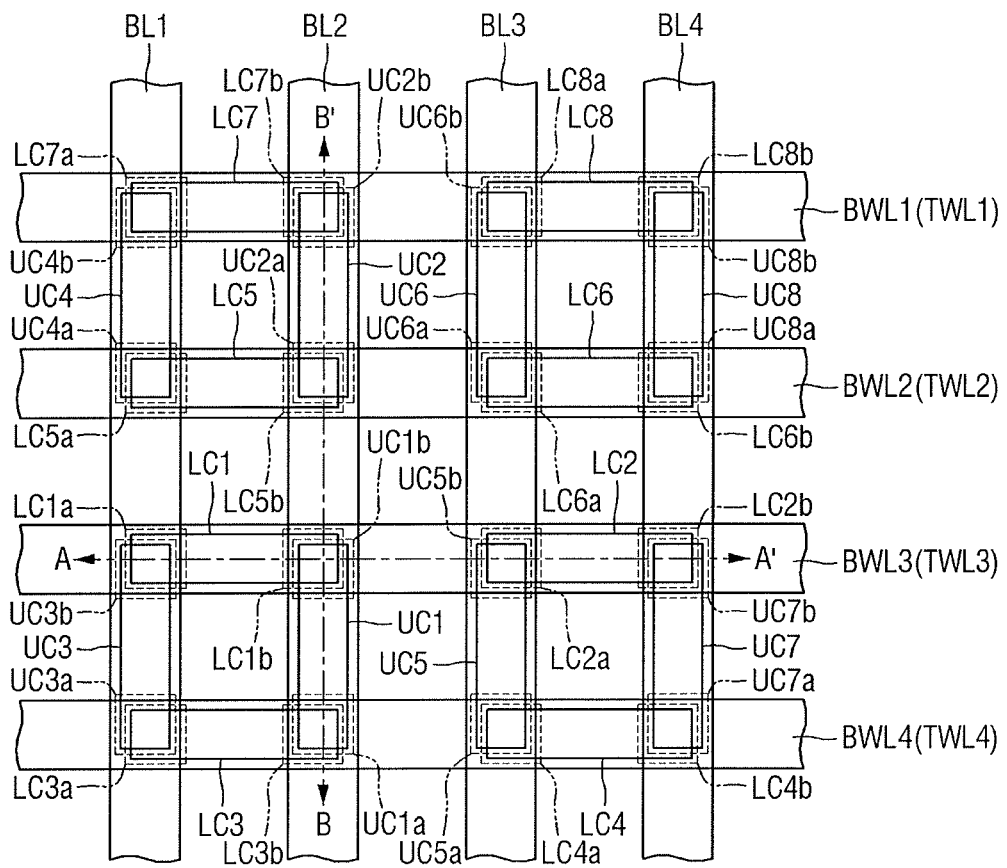
FIG. 1 illustrates an embodiment of a semiconductor device.
Figure 2:
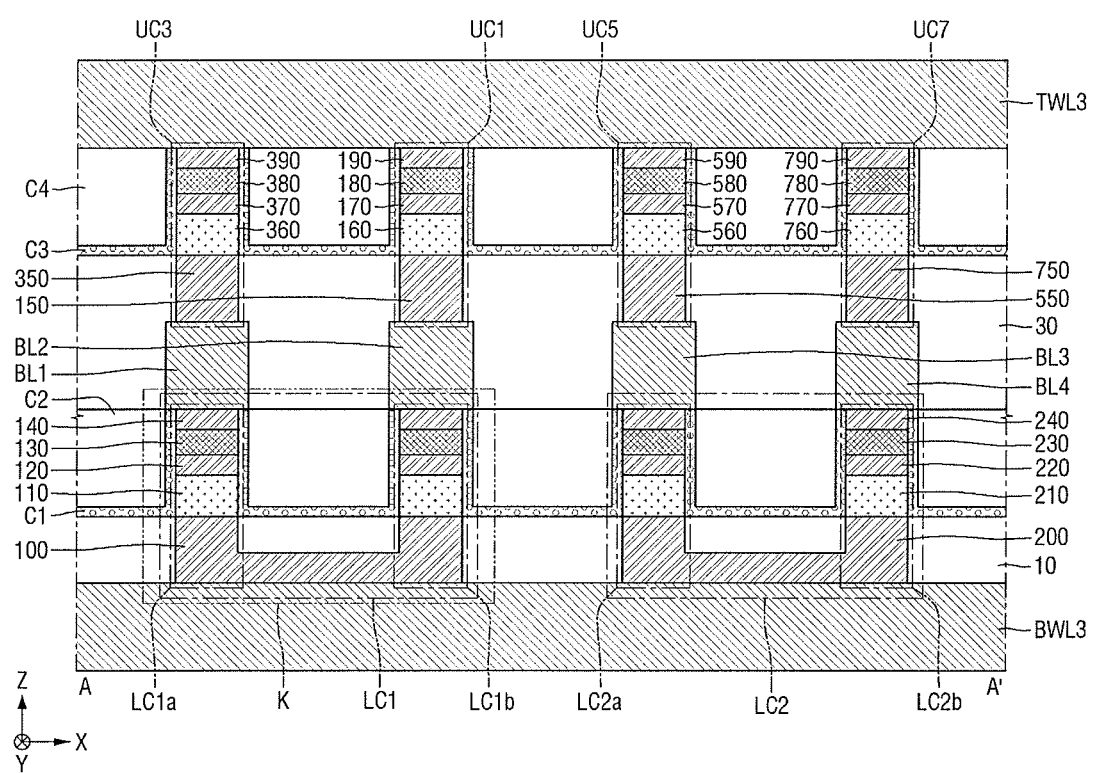
FIG. 2 illustrates a cross-sectional view taken along line A-A' of FIG. 1.
Figure 3:
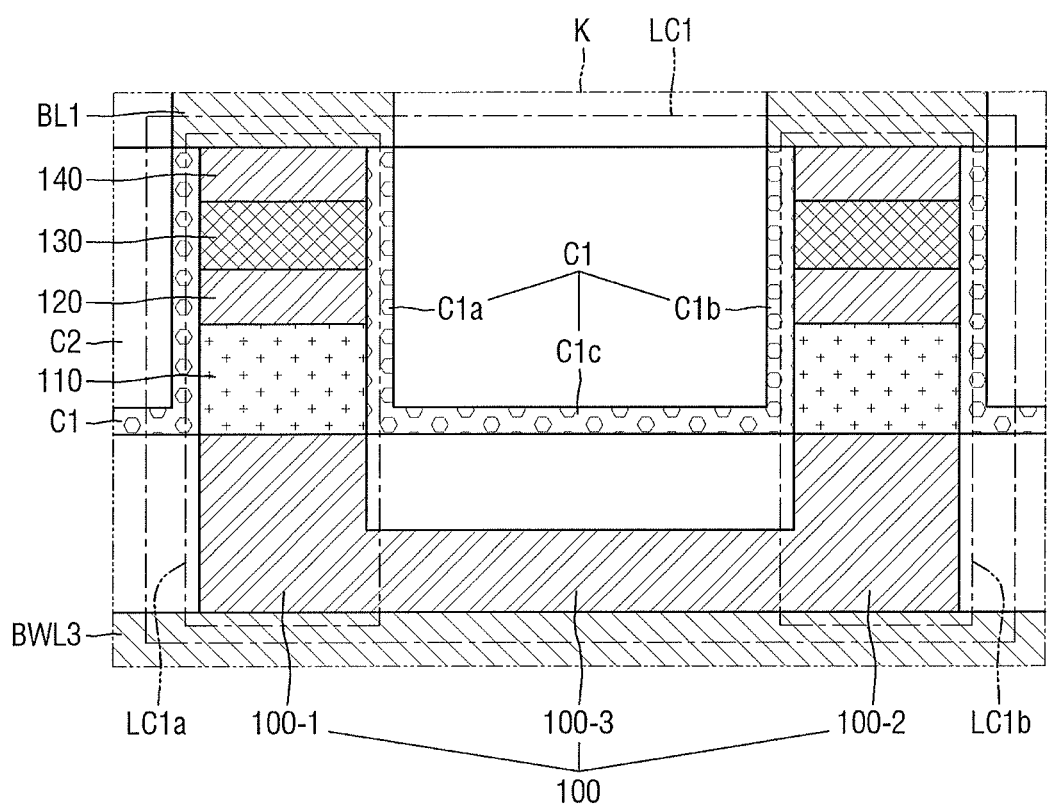
FIG. 3 illustrates an enlarged cross-sectional view of portion K of FIG. 2.
Figure 4:
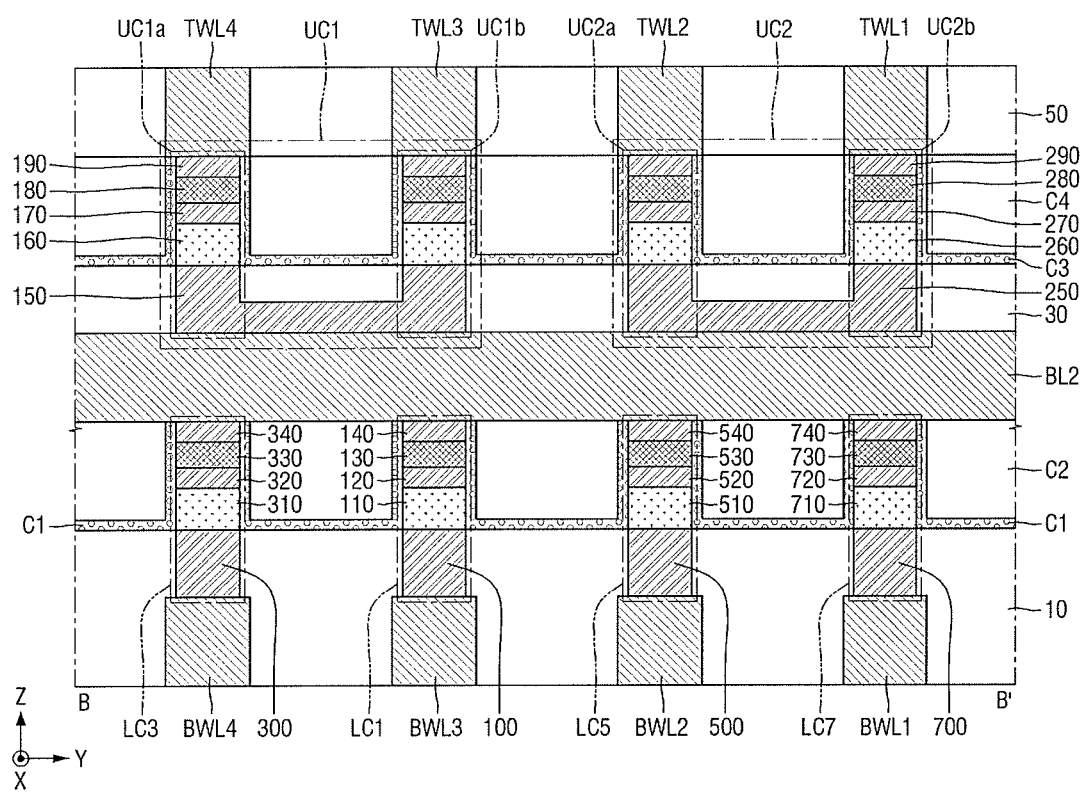
FIG. 4 illustrates a cross-sectional view taken along line B-B' of FIG. 1

FIG. 1 illustrates a layout of an embodiment of a semiconductor device. FIG. 2 illustrates a cross-sectional view taken along line A-A' of FIG. 1. FIG. 3 illustrates an enlarged cross-sectional view of portion K of FIG. 2. FIG. 4 illustrates a cross-sectional view taken along line B-B' of FIG. 1.

Referring to FIGS. 1 to 4, the semiconductor device includes first to fourth lower word lines BWL1 to BWL4, first to fourth upper word lines TWL1 to TWL4, first to fourth bit lines BL1 to BL4, first to eighth lower memory cells LC1 to LC8, first to eighth upper memory cells UC1 to UC8, first to third mold films 10, 30 and 50, first to fourth capping films C1 to C4, and the like. The numbers of upper word lines, lower word lines, upper memory cells, lower memory cells, mold films, and/or capping films may be different in another embodiment.

The first to fourth lower word lines BWL1 to BWL4 may extend side by side in a first direction X. The first to fourth lower word lines BWL1 to BWL4 may be spaced apart from each other in a second direction Y. The first to fourth lower word lines BWL1 to BWL4 may be parallel at the same height level. For example, the second lower word line BWL2 may be between the first lower word line BWL1 and the third lower word line BWL3, and the third lower word line BWL3 may be between the second lower word line BWL2 and the fourth lower word line BWL4.

The first to fourth lower word lines BWL1 to BWL4 may include conductors. For example, the first to fourth lower word lines BWL1 to BWL4 may include metal such as tungsten.

The first to fourth upper word lines TWL1 to TWL4 may extend side by side in the first direction X. The first to fourth upper word lines TWL1 to TWL4 may be spaced apart from each other in the second direction Y. The first to fourth upper word lines TWL1 to TWL4 may be parallel at the same height level. For example, the second upper word line TWL2 may be between the first upper word line TWL1 and the third upper word line TWL3, and the third upper word line TWL3 may be between the second upper word line TWL2 and the fourth upper word line TWL4.

The first to fourth upper word lines TWL1 to TWL4 may be at a higher level than the first to fourth lower word lines BWL1 to BWL4. For example, the first to fourth upper word lines TWL1 to TWL4 may be spaced apart from the first to fourth lower word lines BWL1 to BWL4 in a third direction Z, e.g., a vertical direction. The first to fourth upper word lines TWL1 to TWL4 may overlap the first to fourth lower word lines BWL1 to BWL4 in the third direction Z.

As shown in FIG. 1, the first to fourth upper word lines TWL1 to TWL4 may completely overlap the first to fourth lower word lines BWL1 to BWL4 in the third direction Z. The first to fourth upper word lines TWL1 to TWL4 may include conductors. For example, the first to fourth upper word lines TWL1 to TWL4 may include metal such as tungsten.

The first to fourth bit lines BL1 to BL4 may be between the first to fourth lower word lines BWL1 to BWL4 and the first to fourth upper word lines TWL1 to TWL4. The first to fourth bit lines BL1 to BL4 may extend in parallel in the second direction Y. For example, the first to fourth bit lines BL1 to BL4 may be spaced apart from each other in the first direction X. Accordingly, the first to fourth lower word lines BWL1 to BWL4 and the first to fourth upper word lines TWL1 to TWL4 may intersect the first to fourth bit lines BL1 to BL4 in a plan view, thereby forming a mesh structure.

In one embodiment, the second bit line BL2 may be between the first bit line BL1 and the third bit line BL3, and the third bit line BL3 may be between the second bit line BL2 and the fourth bit line BL4. The first to fourth bit lines BL1 to BL4 may be formed orthogonally to the first to fourth lower word lines BWL1 to BWL4 and the first to fourth upper word lines TWL1 to TWL4. The first to fourth bit lines BL1 to BL4 may include conductors. For example, the first to fourth bit lines BL1 to BL4 may include metal such as tungsten.

Each of the first to eighth lower memory cells LC1 to LC8 may be in contact with any one of the first to fourth lower word lines BWL1 to BWL4 and in contact with two of the first to fourth bit lines BL1 to BL4. For example, the lower surface of the first lower memory cell LC1 may be in contact with the third lower word line BWL3, and the upper surface of the first lower memory cell LC1 may be in contact with the first bit line BL1 and the second bit line BL2.

The first lower memory cell LC1 may include a first-first lower memory cell LC1a and a first-second lower memory cell LC1b. For example, the lower surface of the first-first lower memory cell LC1a may be in contact with the third lower word line BWL3, and the upper surface of the first-first lower memory cell LC1a may be in contact with the first bit line BL1. The lower surface of the first-second lower memory cell LC1b may be in contact with the third lower word line BWL3 and the upper surface of the first-second lower memory cell LC1b may be in contact with the second bit line BL2.

Similarly, the lower surface of the second lower memory cell LC2 may be in contact with the third lower word line BWL3, and the upper surface of the second lower memory cell LC2 may be in contact with the third bit line BL3 and the fourth bit line BL4. The lower surface of the third lower memory cell LC3 may be in contact with the fourth lower word line BWL4, and the upper surface of the third lower memory cell LC3 may be in contact with the first bit line BL1 and the second bit line BL2. The lower surface of the fourth lower memory cell LC4 may be in contact with the fourth lower word line BWL4, and the upper surface of the fourth lower memory cell LC4 may be in contact with the third bit line BL3 and the fourth bit line BL4.

The second lower memory cell LC2 may include a second-first lower memory cell LC2a and a second-second lower memory cell LC2b. For example, the lower surface of the second-first lower memory cell LC2a may be in contact with the third lower word line BWL3, and the upper surface of the second-first lower memory cell LC2a may be in contact with the third bit line BL3. The lower surface of the second-second lower memory cell LC2b may be in contact with the third lower word line BWL3 and the upper surface of the second-second lower memory cell LC2b may be in contact with the fourth bit line BL4.

The third lower memory cell LC3 may include a third-first lower memory cell LC3a and a third-second lower memory cell LC3b. For example, the lower surface of the third-first lower memory cell LC3a may be in contact with the fourth lower word line BWL4, and the upper surface of the third-first lower memory cell LC3a may be in contact with the first bit line BL1. The lower surface of the third-second lower memory cell LC3b may be in contact with the fourth lower word line BWL4, and the upper surface of the third-second lower memory cell LC3b may be in contact with the second bit line BL2.

The fourth lower memory cell LC4 may include a fourth-first lower memory cell LC4a and a fourth-second lower memory cell LC4b. For example, the lower surface of the fourth-first lower memory cell LC4a may be in contact with the fourth lower word line BWL4, and the upper surface of the fourth-first lower memory cell LC4a may be in contact with the third bit line BL3. The lower surface of the fourth-second lower memory cell LC4b may be in contact with the fourth lower word line BWL4, and the upper surface of the fourth-second lower memory cell LC4b may be in contact with the fourth bit line BL4.

Further, the lower surface of the fifth lower memory cell LC5 may be in contact with the second lower word line BWL2, and the upper surface of the fifth lower memory cell LC5 may be in contact with the first bit line BL1 and the second bit line BL2. The lower surface of the sixth lower memory cell LC6 may be in contact with the second lower word line BWL2, and the upper surface of the sixth lower memory cell LC6 may be in contact with the third bit line BL3 and the fourth bit line BL4.

The fifth lower memory cell LC5 may include a fifth-first lower memory cell LC5a and a fifth-second lower fifth memory cell LC5b. For example, the lower surface of the fifth-first lower memory cell LC5a may be in contact with the second lower word line BWL2, and the upper surface of the fifth-first lower memory cell LC5a may be in contact with the first bit line BL1. The lower surface of the fifth-second lower fifth memory cell LC5b may be in contact with the second lower word line BWL2, and the upper surface of the fifth-second lower fifth memory cell LC5b may be in contact with the second bit line BL2.

The sixth lower memory cell LC6 may include a sixth-first lower memory cell LC6a and a sixth-second lower memory cell LC6b. For example, the lower surface of the sixth-first lower memory cell LC6a may be in contact with the second lower word line BWL2, and the upper surface of the sixth-first lower memory cell LC6a may be in contact with the third bit line BL3. The lower surface of the sixth-second lower memory cell LC6b may be in contact with the second lower word line BWL2, and the upper surface of the sixth-second lower memory cell LC6b may be in contact with the fourth bit line BL4.

The lower surface of the seventh lower memory cell LC7 may be in contact with the first lower word line BWL1, and the upper surface of the seventh lower memory cell LC7 may be in contact with the first bit line BL1 and the second bit line BL2. The lower surface of the eighth lower memory cell LC8 may be in contact with the first lower word line BWL1, and the upper surface of the eighth lower memory cell LC8 may be in contact with the third bit line BL3 and the fourth bit line BL4.

The seventh lower memory cell LC7 may include a seventh-first lower memory cell LC7a and a seventh-second lower memory cell LC7b. For example, the lower surface of the seventh-first lower memory cell LC7a may be in contact with the first lower word line BWL1, and the upper surface of the of the seventh-first lower memory cell LC7a may be in contact with the first bit line BL1. The lower surface of the seventh-second lower memory cell LC7b may be in contact with the first lower word line BWL1 and the upper surface of the seventh-second lower memory cell LC7b may be in contact with the second bit line BL2.

The eighth lower memory cell LC8 may include an eighth-first lower memory cell LC8a and an eighth-second lower memory cell LC8b. For example, the lower surface of the eighth-first lower memory cell LC8a may be in contact with the first lower word line BWL1, and the upper surface of the eighth-first lower memory cell LC8a may be in contact with the third bit line BL3. The lower surface of the eighth-second lower memory cell LC8b may be in contact with the first lower word line BWL1, and the upper surface of the eighth-second lower memory cell LC8b may be in contact with the fourth bit line BL4.

Each of the first to eighth upper memory cells UC1 to UC8 may be in contact with any one of the first to fourth bit lines BL1 to BL4 and in contact with two of the first to fourth upper word lines TWL1 to TWL4. For example, the lower surface of the first upper memory cell UC1 may be in contact with the second bit line BL2, and the upper surface of the first upper memory cell UC1 may be in contact with the third upper word line TWL3 and the fourth upper word line TWL4. The lower surface of the second upper memory cell UC2 may be in contact with the second bit line BL2, and the upper surface of the second upper memory cell UC2 may be in contact with the first upper word line TWL1 and the second upper word line TWL2.

The first upper memory cell UC1 may include a first-first upper memory cell UC1a and a first-second upper memory cell UC1b. For example, the lower surface of the first-first upper memory cell UC1a may be in contact with the second bit line BL2, and the upper surface of the first-first upper memory cell UC1a may be in contact with the fourth upper word line TWL4. The lower surface of the first-second upper memory cell UC1b may be in contact with the second bit line BL2 and the upper surface of the first-second upper memory cell UC1b may be in contact with the third upper word line TWL3.

The second upper memory cell UC2 may include a second-first upper memory cell UC2a and a second-second upper memory cell UC2b. For example, the lower surface of the second-first upper memory cell UC2a may be in contact with the second bit line BL2, and the upper surface of the second-first upper memory cell UC2a may be in contact with the second upper word line TWL2. The lower surface of the second-second upper memory cell UC2b may be in contact with the second bit line BL2, and the upper surface of the second-second upper memory cell UC2b may be in contact with the first upper word line TWL1.

Similarly, the lower surface of the third upper memory cell UC3 may be in contact with the first bit line BL1, and the upper surface of the third upper memory cell UC3 may be in contact with the third upper word line TWL3 and the fourth upper word line TWL4. The lower surface of the fourth upper memory cell UC4 may be in contact with the first bit line BL1, and the upper surface of the fourth upper memory cell UC4 may be in contact with the first upper word line TWL1 and the second upper word line TWL2.

The third upper memory cell UC3 may include a third-first upper memory cell UC3a and a third-second upper memory cell UC3b. For example, the lower surface of the third-first upper memory cell UC3a may be in contact with the first bit line BL1, and the upper surface of the third-first upper memory cell UC3a may be in contact with the fourth upper word line TWL4. The lower surface of the third-second upper memory cell UC3b may be in contact with the first bit line BL1 and the upper surface of the third-second upper memory cell UC3b may be in contact with the third upper word line TWL3.

The fourth upper memory cell UC4 may include a fourth-first upper memory cell UC4a and a fourth-second upper memory cell UC4b. For example, the lower surface of the fourth-first upper memory cell UC4a may be in contact with the first bit line BL1, and the upper surface of the fourth-first upper memory cell UC4a may be in contact with the second upper word line TWL2. The lower surface of the fourth-second upper memory cell UC4b may be in contact with the first bit line BL1, and the upper surface of the fourth-second upper memory cell UC4b may be in contact with the first upper word line TWL1.

Further, the lower surface of the fifth upper memory cell UC5 may be in contact with the third bit line BL3, and the upper surface of the fifth upper memory cell UC5 may be in contact with the third upper word line TWL3 and the fourth upper word Line TWL4. The lower surface of the sixth upper memory cell UC6 may be in contact with the third bit line BL3, and the upper surface of the sixth upper memory cell UC6 may be in contact with the first upper word line TWL1 and the second upper word line TWL2.

The fifth upper memory cell UC5 may include a fifth-first upper memory cell UC5a and a fifth-second upper memory cell UC5b. For example, the lower surface of the fifth-first upper memory cell UC5a may be in contact with the third bit line BL3, and the upper surface of the fifth-first upper memory cell UC5a may be in contact with the fourth upper word line TWL4. The lower surface of the fifth-second upper memory cell UC5b may be in contact with the third bit line BL3, and the upper surface of the fifth-second upper memory cell UC5b may be in contact with the third upper word line TWL3.

The sixth upper memory cell UC6 may include a sixth-first upper memory cell UC6a and a sixth-second upper memory cell UC6b. For example, the lower surface of the sixth-first upper memory cell UC6a may be in contact with the third bit line BL3, and the upper surface of the sixth-first upper memory cell UC6a may be in contact with the second upper word line TWL2. The lower surface of the sixth-second upper memory cell UC6b may be in contact with the third bit line BL3, and the upper surface of the sixth-second upper memory cell UC6b may be in contact with the first upper word line TWL1.

The lower surface of the seventh upper memory cell UC7 may be in contact with the fourth bit line BL4, and the upper surface of the seventh upper memory cell UC7 may be in contact with the third upper word line TWL3 and the fourth upper word line TWL4. The lower surface of the eighth upper memory cell UC8 may be in contact with the fourth bit line BL4, and the upper surface of the eighth upper memory cell UC8 may be in contact with the first upper word line TWL1 and the second upper word line TWL2.

The seventh upper memory cell UC7 may include a seventh-first upper memory cell UC7a and a seventh-second upper memory cell UC7b. For example, the lower surface of the seventh-first upper memory cell UC7a may be in contact with the fourth bit line BL4, and the upper surface of the seventh-first upper memory cell UC7a may be in contact with the fourth upper word line TWL4. The lower surface of the seventh-second upper memory cell UC7b may be in contact with the fourth bit line BL4, and the upper surface of the seventh-second upper memory cell UC7b may be in contact with the fourth upper word line TWL4.

The eighth upper memory cell UC8 may include an eighth-first upper memory cell UC8a and an eighth-second upper memory cell UC8b. For example, the lower surface of the eighth-first upper memory cell UC8a may be in contact with the fourth bit line BL4, and the upper surface of the eighth-first upper memory cell UC8a may be in contact with the second upper word line TWL2. The lower surface of the eighth-second upper memory cell UC8b may be in contact with the fourth bit line BL4 and the upper surface of the eighth-second upper memory cell UC8b may be in contact with the first upper word line TWL1.

Referring to FIGS. 1 to 3, the first lower memory cell LC1 includes a first lower cell lower electrode 100, a first lower cell phase change memory 110, a first lower cell intermediate electrode 120, a first lower cell ovonic threshold switch (OTS) 130 and a first lower cell upper electrode 140.

The first lower cell lower electrode 100 may be formed on the upper surface of the third lower word line BWL3. The first lower cell lower electrode 100 may be in direct contact with the third lower word line BWL3. The first lower cell lower electrode 100 may be located at the lowermost portion of the first lower memory cell LC1, and the lower surface of the first lower cell lower electrode 100 may be the lower surface of the first lower memory cell LC1. The first lower cell lower electrode 100 may be shared by the first-first lower memory cell LC1a and the first-second lower memory cell LC1b.

The first lower cell lower electrode 100 may include a conductor. For example, the first lower cell lower electrode 100 may include at least one of W, Ti, Al, Cu, C, CN, TiN, TiAlN, TiSiN, TiCN, WN, CoSiN, WSiN, TaN, TaCN, and TaSiN. The first lower cell lower electrode 100 may serve as a heater to heat the first lower cell phase change memory 110, similarly to the first lower cell intermediate electrode 120 and the first lower cell upper electrode 140 to be described later.

Referring to FIG. 3, the first lower cell lower electrode 100 may include a first part 100-1 corresponding to the first-first lower memory cell LC1a, a second part 100-2 corresponding to the first-second lower memory cell LC1b, and a third part 100-3 corresponding to the first part 100-1 to the second part 100-2. The first part 100-1 and the second part 100-2 may be connected at ends of the third part 100-3 in the first direction X and extend upward.

Referring again to FIGS. 1 to 4, the first lower cell phase change memory 110 may be on the first lower cell lower electrode 100. The first lower cell phase change memory 110 may include a phase change material. The first lower cell phase change memory 110 may be made of various kinds of materials, for example, GaSb, InSb, InSe, SbTe, GeTe, which are obtained by combining two elements, GeSbTe, GeBiTe, GaSeTe, InSbTe, SnSb$_2$Te$_4$, InSbGe, which are obtained by combining three elements, and AgInSbTe, (GeSn)SbTe, GeSb(SeTe), Te$_{81}$Ge$_{15}$Sb$_2$S$_2$, which are obtained by combining four elements. Further, the materials may be doped with nitrogen (N), silicon (Si), carbon (C), or oxygen (O) to improve the semiconductor characteristics of the first lower cell phase change memory 110. For example, GeSbTe doped with nitrogen (N), silicon (Si), carbon (C), or oxygen (O) may be in the first lower cell phase change memory 110.

The first lower cell phase change memory 110 may exist in a crystalline, amorphous, or molten phase depending on the heat generated by the first lower cell lower electrode 100, the first lower cell intermediate electrode 120, and the first lower cell upper electrode 140. The first lower cell phase change memory 110 may store information according to the phase.

The first lower cell intermediate electrode 120 may be formed on the first lower cell phase change memory 110. The first lower cell intermediate electrode 120 may apply heat to the first lower cell phase change memory 110, similarly to the first lower cell lower electrode 100 described above and the first lower cell upper electrode 140 to be described later.

The first lower cell intermediate electrode 120 may include a conductor. For example, the first lower cell lower electrode 100 may include at least one of W, Ti, Al, Cu, C, CN, TiN, TiAlN, TiSiN, TiCN, WN, CoSiN, WSiN, TaN, TaCN, and TaSiN.

The first lower cell OTS 130 may be formed on the first lower cell intermediate electrode 120. The first lower cell OTS 130 may include a chalcogen compound (chalcogenide). The first lower cell OTS 130 may change the phase of the first lower cell phase change memory 110 to one of amorphous (on) and crystalline (off) phases.

The first lower cell OTS 130 may change the phase of the first lower cell phase change memory 110 according to the voltage applied to the first lower cell phase change memory 110. Accordingly, the first lower cell OTS 130 may serve as a switch of the memory. For example, the first lower cell OTS 130 may switch the phase of the first lower cell phase change memory 110 depending on whether the current passing through the first lower cell OTS 130 exceeds a threshold current or whether the voltage across the first lower cell OTS 130 exceeds a threshold voltage.

The first lower cell upper electrode 140 may be formed on the first lower cell OTS 130. The first lower cell upper electrode 140 may apply heat to the first lower cell phase change memory 110, similarly to the first lower cell lower electrode 100 and the first lower cell intermediate electrode 120 described above.

The semiconductor device according to some embodiments may configure the first lower memory cell LC1 with only the first lower cell lower electrode 100 and the first lower cell upper electrode 140. However, by adding the first lower cell intermediate electrode 120, heating efficiency may be further increased and the operation speed of the memory may be further enhanced.

A second lower cell lower electrode 200 may be formed on the upper surface of the third lower word line BWL3. The second lower memory cell LC2 may have the same structure as the first lower memory cell LC1. For example, the first lower cell lower electrode 100, the first lower cell phase change memory 110, the first lower cell intermediate electrode 120, the first lower cell OTS 130, and the first lower cell upper electrode 140 may correspond to the second lower cell lower electrode 200, a second lower cell phase change memory 210, a second lower cell intermediate electrode 220, a second lower cell OTS 230, and a second lower cell upper electrode 240, respectively.

Each of the third to eighth lower memory cells LC3 to LC8 may have the same structure as the first lower memory cell LC1. For example, the third to eighth lower memory cells LC3 to LC8 may include third to eighth lower cell lower electrodes 300 to 800, third to eighth lower cell phase change memories 310 to 810, third to eighth lower cell intermediate electrodes 320 to 820, third to eighth lower cell OTSs 330 to 830, and third to eighth lower cell upper electrodes 340 to 840, respectively.

The first lower cell phase change memory 110, the first lower cell intermediate electrode 120, the first lower cell OTS 130, and the first lower cell upper electrode 140 may have the same width in the first direction X. This is because the first lower cell phase change memory 110, the first lower cell intermediate electrode 120, the first lower cell OTS 130, and the first lower cell upper electrode 140 may be patterned by a single process. This characteristic may also apply to the second to eighth lower memory cells LC2 to LC8.

The first to eighth lower memory cells LC1 to LC8 may have a high aspect ratio. The aspect ratio of the first to eighth lower memory cells LC1 to LC8 may be, for example, 5 to 20. The aspect ratio may be in a different range in another embodiment.

All of the first to fourth lower word lines BWL1 to BWL4, the first to fourth upper word lines TWL1 to TWL4, the first to fourth bit lines BL1 to BL4, the memory cells LC1 to LC8, and the first to eighth upper memory cells UC1 to UC8 may be covered by the first to third mold films 10, 30 and 50, and the first to fourth capping films C1 to C4. The first to third mold films 10, 30, and 50 may be made of at least one of SiN, SiO$_2$, and Si.

According to some embodiments, the first to eighth lower cell lower electrodes 100 to 800 may be in direct contact with the first mold film 10 without spacers. When the first mold film 10 is made of SiN, oxidation of an interface does not occur even due to the heat generated when heating the first to eighth lower cell lower electrodes 100 to 800. As a result, thermal durability of the semiconductor device may be improved.

The first capping film C1 may surround the side surfaces of the first to eighth lower memory cells LC1 to LC8. For example, the first capping film C1 may surround each of the side surfaces of the first-first to eighth-first lower memory cells LC1a to LC8a and the first-second to eighth-second lower memory cells LC1b to LC8b. The first capping film C1 may be formed along the upper surface of the first mold film 10.

The first capping film C1 may surround the side surfaces of the first-first to eighth-first lower memory cells LC1a to LC8a and the first-second to eighth-second lower memory cells LC1b to LC8b, but may not surround the side surfaces of the first to eighth lower cell lower electrodes 100 to 800. The side surfaces of the first to eighth lower cell lower electrodes 100 to 800 may be surrounded by the first mold film 10. For example, the first capping film C1 may surround the side surfaces of the first lower cell phase change memory 110, the first lower cell intermediate electrode 120, the first lower cell OTS 130, and the first lower cell upper electrode 140. This characteristic may also apply to the second to eighth lower memory cells LC2 to LC8.

Referring to FIG. 3, the first capping film C1 may include, for example, a first portion C1a surrounding the side surface of the first-first lower memory cell LC1a, a second portion C1b surrounding the side surface of the first-second lower memory cell LC1b and a third portion C1c covering the upper surface of the first mold film 10. The first portion C1a, the second portion C1b, and the third portion C1c may be formed conformally along the side surface of the first-first lower memory cell LC1a, the side surface of the first-second lower memory cell LC1b, and the upper surface of the first mold film 10, respectively.

Referring again to FIGS. 1 to 4, the second capping film C2 may be formed on the first capping film C1. The second capping film C2 may fill a space between the first to eighth lower memory cells LC1 to LC8. The height of the upper surface of the second capping film C2 may be the same as the height of the upper surfaces of the first to eighth lower memory cells LC1 to LC8, e.g., the height of the upper surfaces of the first to eighth lower cell upper electrodes 140 to 840.

The first capping film C1 and the second capping film C2 may have different characteristics. Since the first capping film C1 is formed by an N$_2$ plasma at a low temperature, it may protect the first lower cell OTS 130 by suppressing the volatilization of the OTS in the memory cell.

However, as the first capping film C1 is formed at a low temperature, a wet etch rate (WER) with respect to hydrogen fluoride (HF) may be large. Therefore, it is highly likely to be damaged by a subsequent etching process. Also, the first capping film C1 may be formed in a low temperature process and may have a poor step coverage characteristic. For example, when the space between the memory cells is filled with only the first capping film C1, there is a high possibility that an air gap or seam will form. Such an air gap or seam may cause damage to the OTS in conjunction with the above-mentioned characteristic of increasing the wet etch rate with respect to HF. For example, etching chemicals penetrate close to the OTS along the air gap or the seam in a subsequent etching process, and the wet etch rate of the first capping film C1 is also large. Thus, the OTS may be exposed and damaged.

According to some embodiments, the second capping film C2 may be additionally formed on the first capping film C1 to compensate for a problem of causing damage to the OTS. The second capping film C2 may be formed using an N$_2$ plasma and an NH$_3$ plasma in a relatively high temperature process (e.g., within a predetermined range), as compared to the first capping film C1. (A deposition process of the second capping film C2 may also be performed, for example, at 130 to 400° C.). This may allow the second capping film C2 to have a lower wet etch rate and a better step coverage characteristic. Accordingly, it is possible to completely fill the periphery of the memory cell without forming an air gap or seam, and thus a better step coverage characteristic may be achieved. This may prevent HF or the like from penetrating the periphery of the OTS in a subsequent etching process. Furthermore, since it has a lower wet etch rate, it is possible to prevent HF from penetrating the second capping film C2 and approaching the OTS. Thus, the semiconductor device according to some embodiments may have higher reliability.

Each of the first capping film C1 and the second capping film C2 may include at least one of SiN, SiON, SiCN and SiBN. In addition, the first capping film C1 and the second capping film C2 may include different materials. For example, the first capping film C1 may be SiON and the second capping film C2 may be SiN. The materials of the first capping film C1 and the second capping film C2 may be different in another embodiment, as long as they have different characteristics in terms of the step coverage characteristic and wet etching characteristic as described above.

A first upper cell lower electrode 150 may be formed on the upper surface of the second bit line BL2. The first upper memory cell UC1 may have the same structure as the first lower memory cell LC1. For example, the first lower cell upper electrode 100, the first lower cell phase change memory 110, the first lower cell intermediate electrode 120, the first lower cell OTS 130, and the first lower cell upper electrode 140 may correspond to the first upper cell lower electrode 150, a first upper cell phase change memory 160, a first upper cell intermediate electrode 170, a first upper cell OTS 180, and a second upper cell upper electrode 290.

This structural feature may also apply to the second to eighth upper memory cells UC2 to UC8. For example, the second to eighth upper memory cells UC2 to UC8 may include second to eighth upper cell lower electrodes 250 to 850, second to eighth upper cell phase change memories 260 to 860, second to eighth upper cell intermediate electrodes 270 to 870, second to eighth upper cell OTSs 280 to 880, and second to eighth upper cell upper electrodes 290 to 890, respectively.

The first to eighth upper memory cells UC1 to UC8 may have a high aspect ratio. For example, the aspect ratio of the first to eighth upper memory cells UC1 to UC8 may be 5 to 20. The aspect ratio may be different in another embodiment.

The extending direction of the first to eighth lower memory cells LC1 to LC8 is the first direction X and the extending direction of the first to eighth upper memory cells UC1 to UC8 is the second direction Y. When the memory cell has a rectangular cross section and includes a long side and a short side, the extending direction may be, for example, a direction in which the long side extends.

Therefore, the first to eighth upper memory cells UC1 to UC8 have the same structure as the first to eighth lower memory cells LC1 to LC8, but the extending directions are different from each other and the vertical levels may be different from each other. For example, when the vertical level of the first to eighth upper memory cells UC1 to UC8 is between the bit lines and the upper word lines, the vertical level of the first to eighth lower memory cells LC1 to LC8 may be between the bit lines and the lower word lines.

The third capping film C3 and the fourth capping film C4 may correspond to the first capping film C1 and the second capping film C2, respectively. For example, the third capping film C3 may protect the OTS by the low temperature process, as compared with the fourth capping film C4, but it may have a poor step coverage characteristic and a high wet etch rate (e.g., within a predetermined range). On the other hand, the fourth capping film C4 may have a relatively excellent step coverage characteristic and a relatively low wet etch rate, thereby preventing penetration of HF in a subsequent process.

Figure 5:
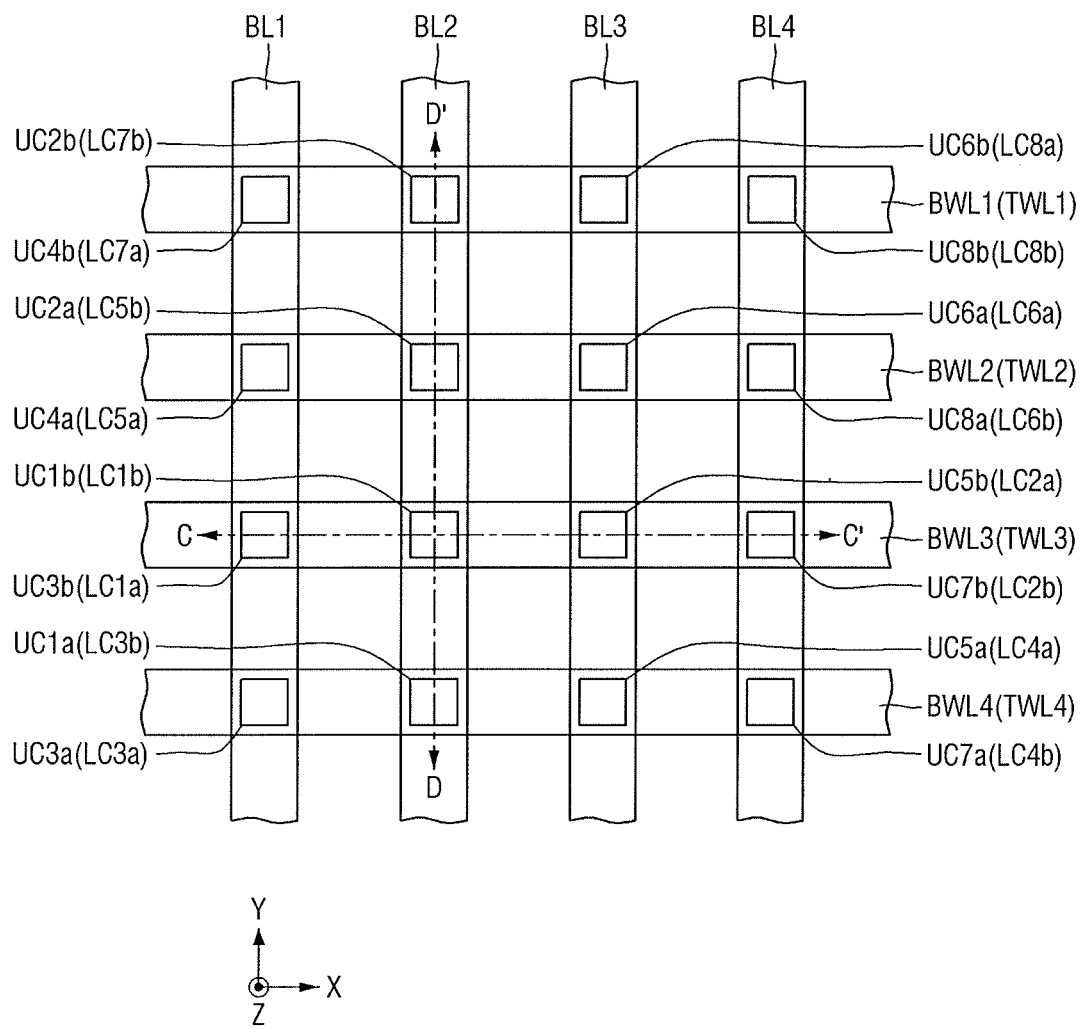
FIG. 5 illustrates another embodiment of a semiconductor device.
Figure 6:
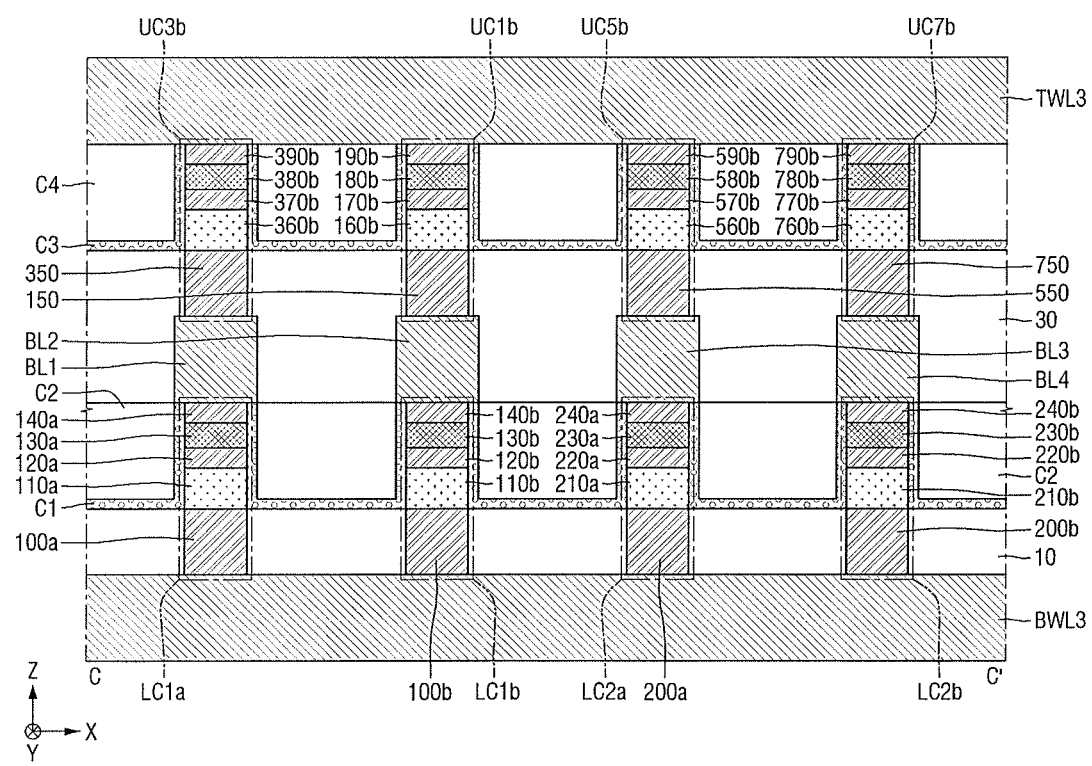
FIG. 6 illustrates a cross-sectional view taken along line C-C' of FIG. 5.
Figure 7:
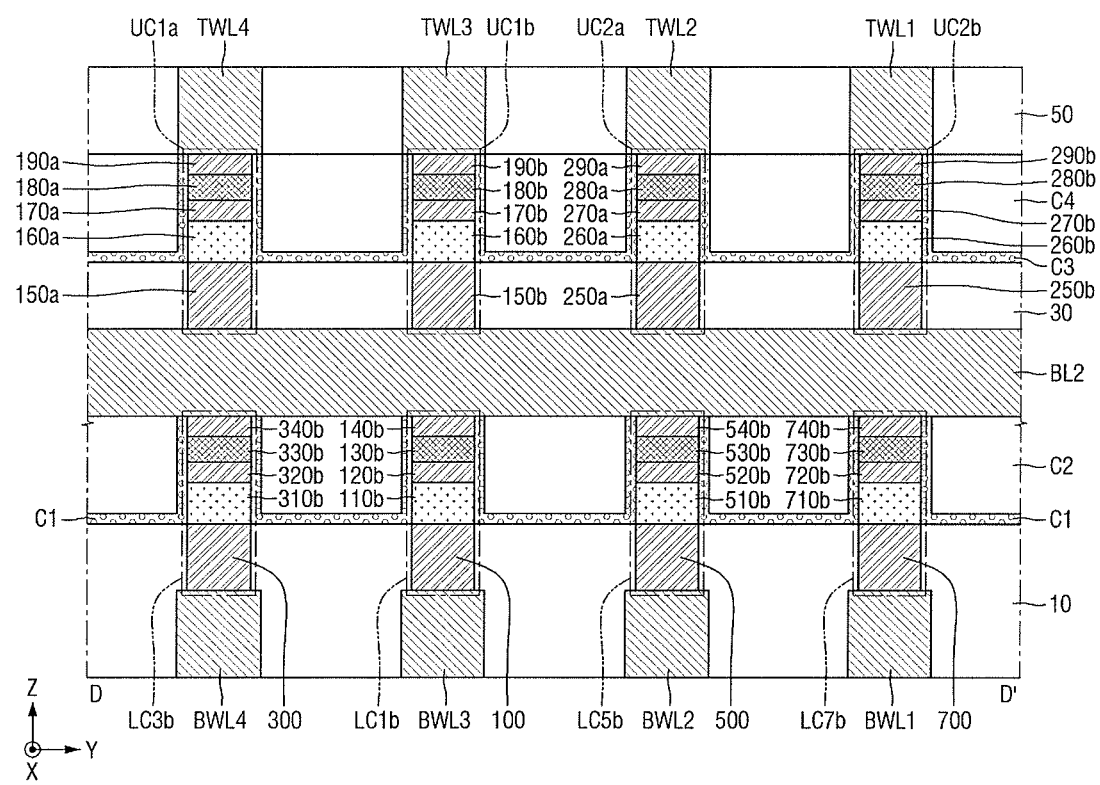
FIG. 7 illustrates a cross-sectional view taken along line D-D' of FIG. 5.

FIG. 5 illustrates a layout of another embodiment of a semiconductor device. FIG. 6 illustrates a cross-sectional view taken along line C-C' of FIG. 5. FIG. 7 illustrates a cross-sectional view taken along line D-D' of FIG. 5.

Referring to FIGS. 5 to 7, the semiconductor device may have a bar structure, which is different from the dash structure of the first to eighth upper memory cells UC1 to UC8 and the first to eighth lower memory cells LC1 to LC8 of FIGS. 1 to 4. For example, the first-first to eighth-first lower memory cells LC1a to LC8a and the first-second to eighth-second lower memory cells LC1b to LC8b may be completely separated from each other, and the first-first to eighth-first upper memory cells UC1a to UC8a and the first-second to eighth-second upper memory cells UC1b to UC8b may be completely separated from each other.

Accordingly, the first-first to eighth-first lower memory cells LC1a to LC8a includes may include first-first to eighth-first lower cell phase change memories 110a to 810a, first-first to eighth-first lower cell intermediate electrodes 120a to 820a, first-first to eighth-first lower cell OTSs 130a to 830a, and first-first to eighth-first lower cell upper electrodes 140a to 840a, respectively.

The first-second to eighth-second lower memory cells LC1b to LC8b may include first-second to eighth-second lower cell phase change memories 110b to 810b, first-second to eighth-second lower cell intermediate electrodes 120b to 820b, first-second to eighth-second lower cell OTSs 130b to 830b, and first-second to eighth-second lower cell upper electrodes 140b to 840b, respectively.

The first-first to eighth-first upper memory cells UC1a to UC8a may include first-first to eighth-first upper cell phase change memories 160a to 860a, first-first to eighth-first upper cell intermediate electrodes 170a to 870a, first-first to eighth-first upper cell OTSs 180a to 880a, and first-first to eighth-first upper cell upper electrodes 190a to 890a, respectively.

The first-second to eighth-second upper memory cells UC1b to UC8b may include first-second to eighth-second upper cell phase change memories 160b to 860b, first-second to eighth-second upper cell intermediate electrodes 170b to 870b, first-second to eighth-second upper cell OTSs 180b to 880b, and first-second to eighth-second upper cell upper electrodes 190b to 890b, respectively.

In a dash structure, two stacks are connected together to increase the efficiency of the process. In the bar structure of the present embodiment, the device isolation of the cell is improved, and interference with adjacent cells may be greatly reduced. Accordingly, the reliability of the semiconductor device may be greatly improved.

Figure 8:
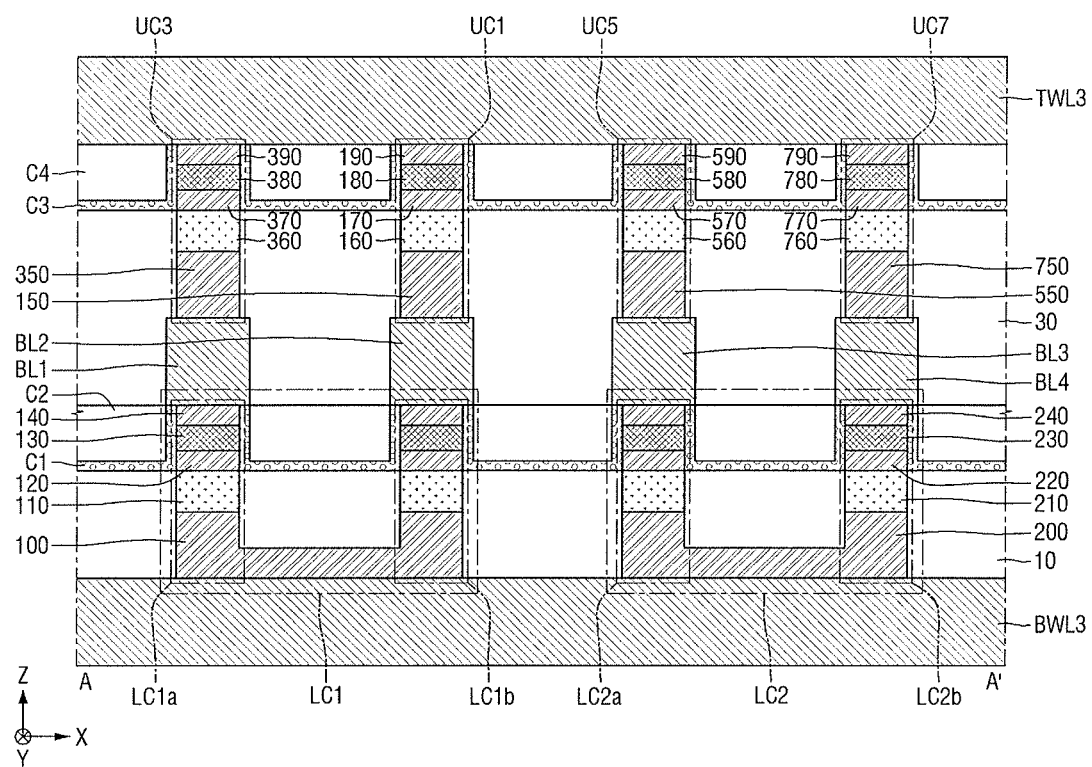
FIG. 8 illustrates another embodiment of a semiconductor device.

FIG. 8 illustrates a cross-sectional view of another embodiment of a semiconductor device. Referring to FIG. 8, a semiconductor device may be configured such that the height of the upper surface of the first mold film 10 is increased up to the height of the upper surface of the phase change memory of the first lower cell phase change memory 110. As a result, the above-described embodiment and this embodiment are the same in that the first capping film C1 surrounds the OTS. However, the second capping film C2 may be formed to have a relatively small depth (e.g., within a predetermined range) in this embodiment, as compared with the above-described embodiment. As a result, an air gap or seam may not be formed even when the step coverage capability is not relatively large.

For example, the semiconductor device of this embodiment may alleviate the restriction of the step coverage characteristic of the second capping film C2, to further reduce the possibility of the formation of an air gap or seam, thereby providing higher reliability.

Similarly, the third capping film C3 and the fourth capping film C4 may be configured as described above as the upper surface of the second mold film 30 is raised to the height of the upper surface of the first upper cell phase change memory 160. Thus, the restriction of the step coverage characteristic of the fourth capping film C4 may be alleviated to further reduce the possibility of the formation of an air gap or seam, thereby providing higher reliability.

Figure 9:
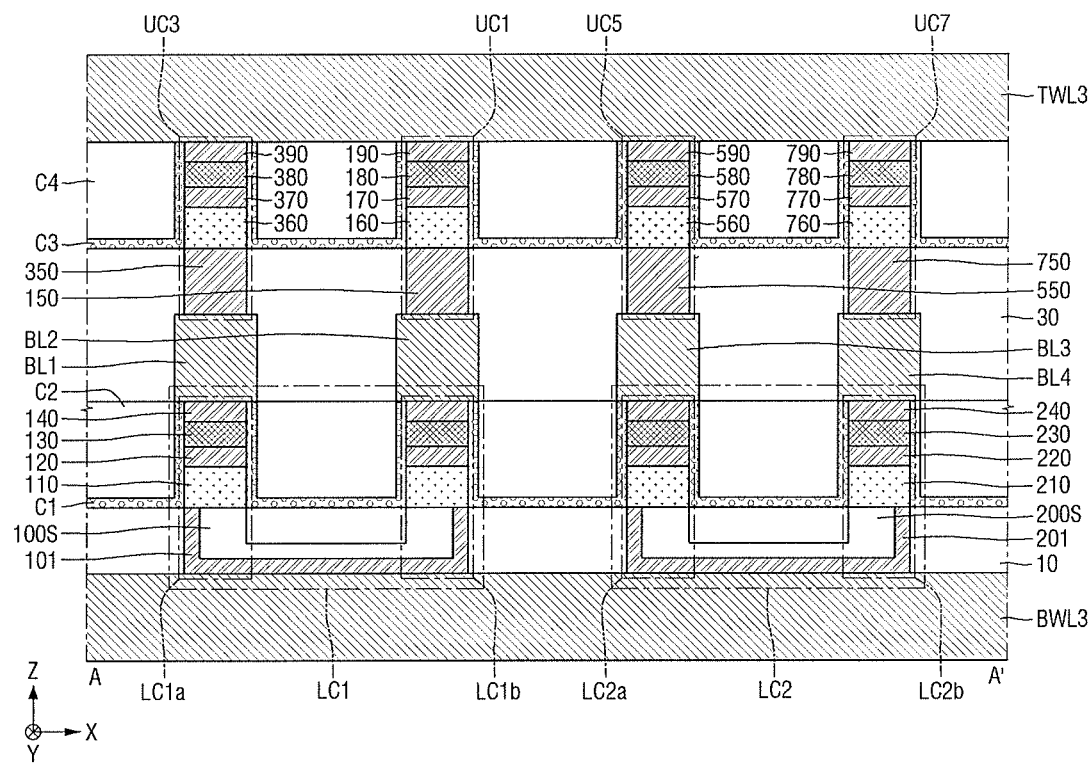
FIG. 9 illustrates another embodiment of a semiconductor device.

FIG. 9 illustrates a cross-sectional view of another embodiment of a semiconductor device. Referring to FIG. 9, the semiconductor device may further include a first spacer 100S on the upper surface of a first lower cell lower electrode 101. The first spacer 100S may be used as an etch stop layer for forming the first lower cell lower electrode 101 in a process of forming the first lower cell lower electrode 101.

Thus, the first mold film 10 may be formed first, and the first lower cell lower electrode 101 having a U-shaped structure may be formed more firmly. Similarly, a second spacer 200S may be formed on the upper surface of a second lower cell lower electrode 1. This may also apply to the first to eighth upper memory cells UC1 to UC8 as well as the third to eighth lower memory cells LC3 to LC8. Consequently, overall durability of the semiconductor device of this embodiment may be greatly improved.

FIGS. 10 to 26 illustrate intermediate operations corresponding to an embodiment of a method for fabricating a semiconductor device, which, for example, may correspond to one or more of the aforementioned embodiments.

Figure 10:
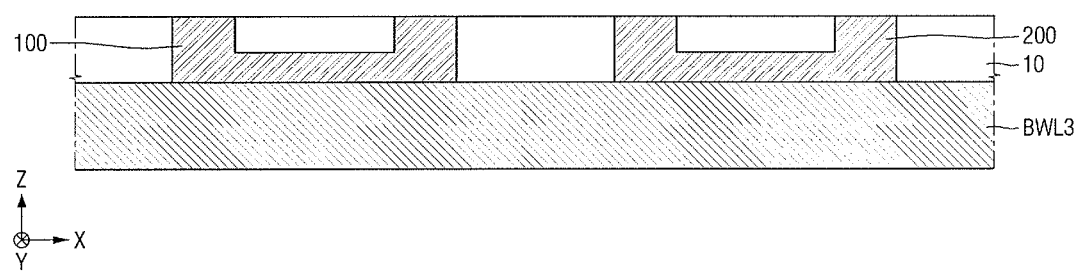
FIGS. 10 to 26 illustrate intermediate stages corresponding to an embodiment of a method for fabricating a semiconductor device.

Referring to FIG. 10, the method initially involves forming the third lower word line BWL3 extending in the first direction X. Although the lower word lines other than the third lower word line BWL3 are not shown in the figure, the first to fourth lower word lines BWL1 to BWL4 may be formed together. For convenience, only a portion corresponding to the cross section along line A-A' of FIG. 1 will be described below.

Then, the first mold film 10, the first lower cell lower electrode 100, and the second lower cell lower electrode 200 are formed on the third lower word line BWL3. At this time, the first lower cell lower electrode 100 and the second lower cell lower electrode 200 may be formed to have a U-shaped structure. The first lower cell lower electrode 100 and the second lower cell lower electrode 200 may be formed of a material such as W, Ti, Al, Cu, C, CN, TiN, TiAlN, TiSiN, TiCN, WN, CoSiN, WSiN, TaN, TaCN, and TaSiN. The first lower cell lower electrode 100 and/or the second lower cell lower electrode 200 may be formed of a different material in another embodiment. The first mold film 10 may be formed on the upper and side surfaces of the third lower word line BWL3. The first mold film 10 may include, for example, one of SiN, $SiO_2$ and Si.

Figure 11:
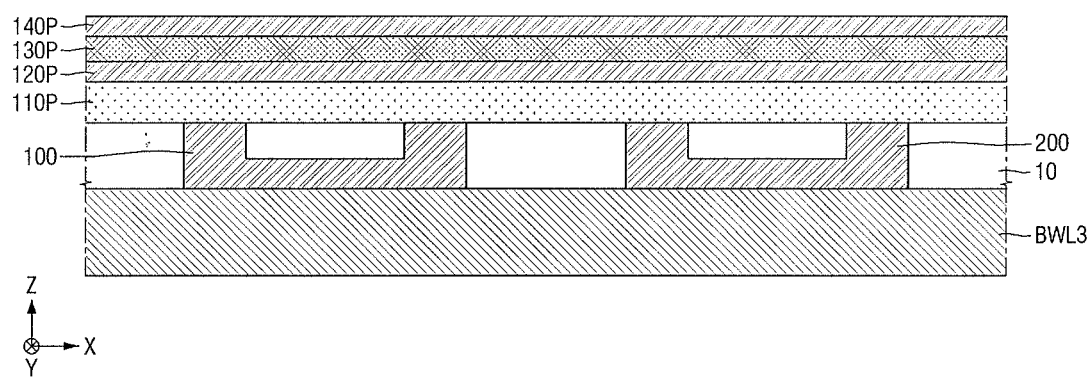

Referring to FIG. 11, a lower cell phase change memory film 110P, a lower cell intermediate electrode film 120P, a lower cell OTS film 130P, and a lower cell upper electrode film 140P are sequentially formed.

The lower cell phase change memory film 110P may include a phase change material, e.g., GaSb, InSb, InSe, SbTe, GeTe formed by combining two elements, GeSbTe, GeBiTe, GaSeTe, InSbTe, $SnSb_2Te_4$, InSbGe formed by combining three elements, and/or AgInSbTe, (GeSn)SbTe, GeSb(SeTe), $Te_{81}Ge_{15}Sb_2S_2$ formed by combining four elements. The materials may be doped with nitrogen (N), silicon (Si), carbon (C), or oxygen (O) to improve the semiconductor characteristics of the lower cell phase change memory film 110P. For example, GeSbTe doped with nitrogen (N), silicon (Si), carbon (C), or oxygen (O) may be in the lower cell phase change memory film 110P.

The lower cell intermediate electrode film 120P may include a conductor. For example, the lower cell intermediate electrode film 120P may include at least one of W, Ti, Al, Cu, C, CN, TiN, TiAlN, TiSiN, TiCN, WN, CoSiN, WSiN, TaN, TaCN, and TaSiN. The lower cell OTS film 130P may include a chalcogen compound. The lower cell upper electrode film 140P may include at least one of W, Ti, Al, Cu, C, CN, TiN, TiAlN, TiSiN, TiCN, WN, CoSiN, WSiN, TaN, TaCN, and TaSiN.

Figure 12:
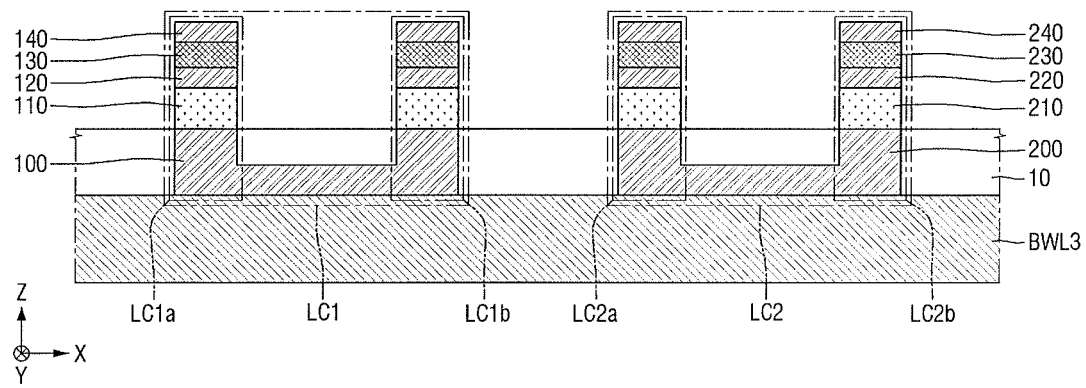

Referring to FIG. 12, the lower cell phase change memory film 110P, the lower cell intermediate electrode film 120P, the lower cell OTS film 130P, and the lower cell upper electrode film 140P are patterned to form the first lower memory cell LC1 and the second lower memory cell LC2.

The first lower memory cell LC1 may include the first-first lower memory cell LC1a and the first-second lower memory cell LC1b. The second lower memory cell LC2 may include the second-first lower memory cell LC2a and the second-second lower memory cell LC2b.

The lower cell phase change memory film 110P may be patterned into the first lower cell phase change memory 110 and the second lower cell phase change memory 210. The lower cell intermediate electrode film 120P may be patterned into the first lower cell intermediate electrode 120 and the second lower cell intermediate electrode 220. In addition, the lower cell OTS film 130P may be patterned into the first lower cell OTS 130 and the second lower cell OTS 230. The lower cell upper electrode film 140P may be patterned into the first lower cell upper electrode 140 and the second lower cell upper electrode 240.

The method for forming the first lower memory cell LC1 and the second lower memory cell LC2 as described above may also apply to the third to eighth lower memory cells LC3 to LC8.

Figure 13:
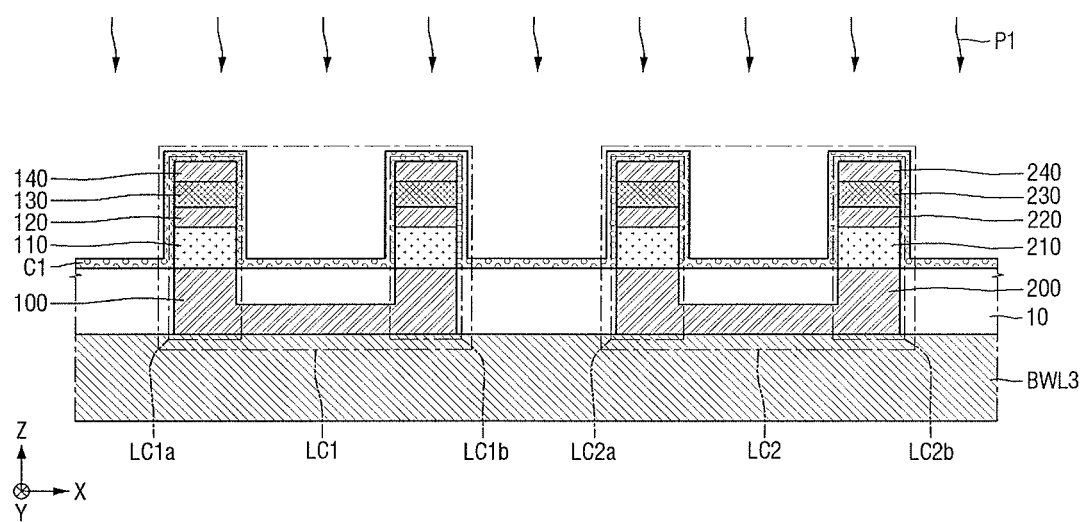
Figure 14:
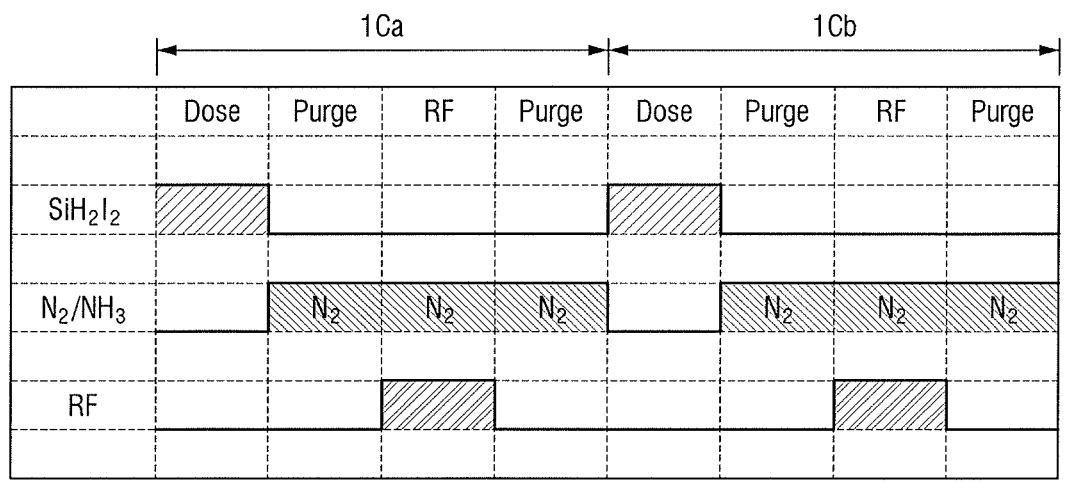

Referring to FIGS. 13 and 14, the first capping film C1 is formed. The first capping film C1 may be formed along the upper surface of the first mold film 10 and the side and upper surfaces of the first lower memory cell LC1 and the second lower memory cell LC2. Since the first lower cell OTS 130 and the second lower cell OTS 230 have high volatility at a high temperature (e.g., within a predetermined range), the first capping film C1 may be formed at a low temperature process. The low temperature process may be performed, for example, at a temperature of 150 to 250° C. or in another temperature range.

The first capping film C1 may be formed to surround the side surfaces of the first lower memory cell LC1 and the second lower memory cell LC2. However, the first lower cell lower electrode 100 and the second lower cell lower electrode 200 may be already surrounded by the first mold film 10 and may not be in contact with the first capping film C1.

The first capping film C1 may also be formed along the upper surface of the first mold film 10. Accordingly, the first capping film C1 may have a connected structure while surrounding each of the first lower memory cell LC1 and the second lower memory cell LC2. The first capping film C1 may be formed using a first plasma P1, e.g., an $N_2$ plasma.

In the process of forming the first capping film C1, first, a dose operation is performed. A silicon source containing silicon may be supplied in the dose operation. The silicon source may be, for example, at least one of $SiH_2I_2$, $SiI_4$, $SiBr_4$, $SiBr_2$, $SiH_4$, $Si_2H_6$, or a another material.

Then, a purge operation is performed. In this operation, an $N_2$ gas may be supplied while purging a substrate serving as a deposition target and the like.

Then, a radio frequency (RF) plasma operation is performed. In this operation, an RF voltage is applied to form the $N_2$ gas in a plasma state, so that deposition may be performed.

Then, the purge operation is performed again, and the $N_2$ gas may be continuously supplied until this time.

The dose operation, the purge operation, the RF plasma operation, and the purge operation are performed successively, may form a first cycle 1Ca, and may be repeated again in a subsequent second cycle 1Cb. Only two cycles are shown in FIG. 14. In another embodiment, the method may be performed in only one cycle or may be performed in three or more cycles continuously.

As the first capping film C1 is deposited at a relatively low temperature, the first lower cell OTS 130 and the second lower cell OTS 230, which are exposed, may be protected without being damaged.

Figure 15:
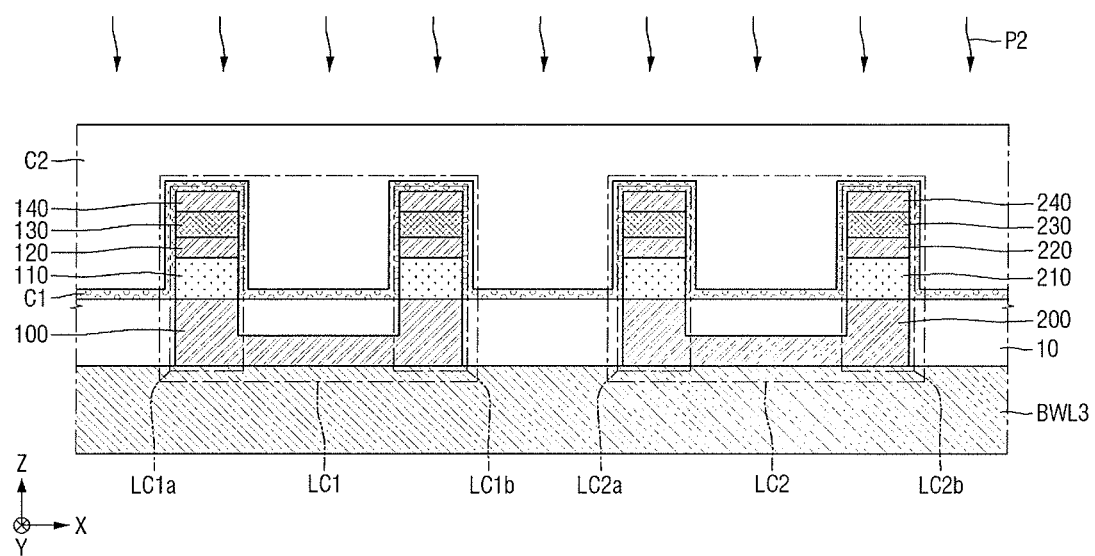
Figures 16, 17:
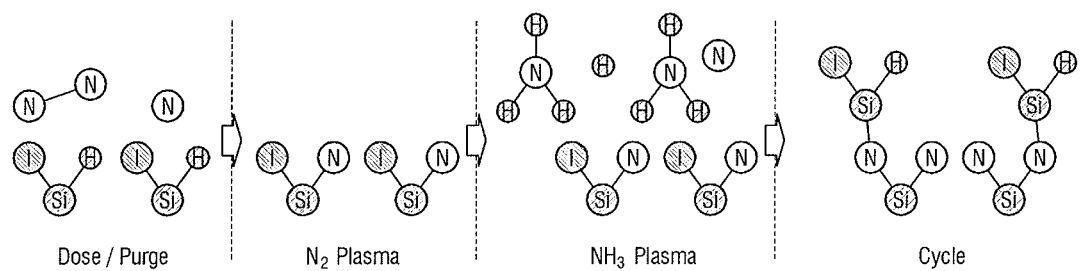

Referring to FIGS. 15 to 17, the second capping film C2 is formed. Formation of the second capping film C2 may proceed in-situ in the same chamber in succession to the formation of the first capping film C1. The second capping film C2 may be formed on the first capping film C1. The second capping film C2 may completely fill a gap between the first lower cell OTS 130 and the second lower cell OTS 230 (i.e., gap fill). The second capping film C2 may be formed using a second plasma P2, e.g., $NH_3$ plasma.

In the process of forming the second capping film C2, first, a dose operation is performed. A silicon source containing silicon is supplied in the dose operation. For example, the silicon source may be at least one of $SiH_2I_2$, $SiI_4$, $SiBr_4$, $SiBr_2$, $SiH_4$, $Si_2H_6$, or another material. For convenience, the following description will be made on the basis of $SiH_2I_2$. In this operation, Si, I, and H atoms may be bonded.

Subsequently, a purge operation is performed. In this operation, $N_2$ gas may be supplied while purging a substrate serving as a deposition target and the like. Also, in this operation, Si, I, and H atoms are bonded, and N atoms are not yet bonded thereto.

Then, an RF plasma operation is performed. In this operation, an RF voltage is applied to form the $N_2$ gas in a plasma state, so that deposition may be performed. In this operation, Si, I, and N atoms may be bonded.

Then, an $NH_3$ processing operation is performed. In this operation, an RF voltage is directly applied, and an $NH_3$ gas is supplied instead of the $N_2$ gas, so that deposition may be performed in a plasma state. In this operation, among the bonded Si, I, and N atoms, I atoms may be bonded to H atoms of the supplied $NH_3$. Accordingly, the content of I atoms in the formed second capping film C2 may be reduced.

Then, the purge operation is performed again. At this time, the $N_2$ gas may be supplied again.

The dose operation, the purge operation, the RF plasma operation, the $NH_3$ processing operation, and the purge operation may be performed successively, may form a third cycle 2Ca, and may be repeated again in a subsequent fourth cycle 2Cb. Only two cycles are shown in FIG. 16. In other embodiments, the method may be performed in only one cycle or may be performed in three or more cycles continuously. As the cycle continues, an SiN-based film having a low content of I atoms may be formed.

For this reason, the second capping film C2 may have a very low wet etch rate with respect to HF. For example, since the amount of I atoms bonded to H of HF is relatively small (e.g., within a predetermined range), it may endure wet etching so that the first capping film C1 and the OTS located internally may be protected. Furthermore, the step coverage characteristics are also improved, and an air gap or seam between the memory cells may not be generated at all. As a result, protection of the OTS may be performed more effectively.

Figure 18:
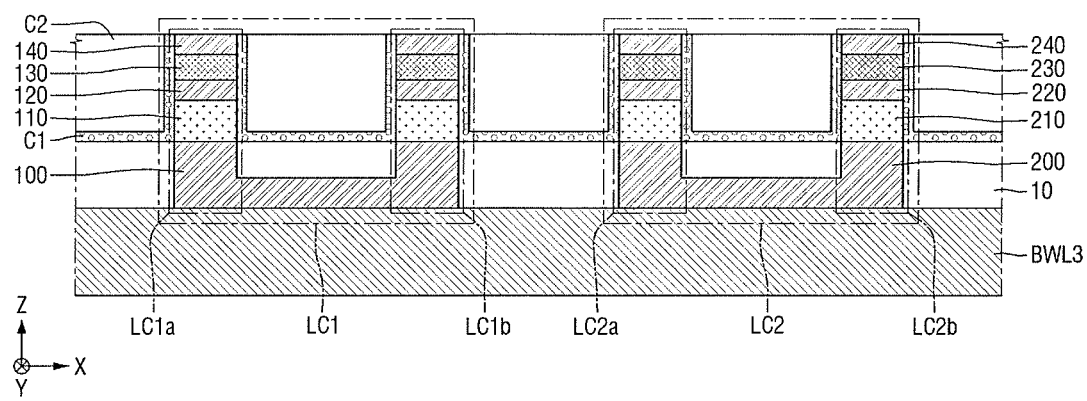

Referring to FIG. 18, a portion of the second capping film C2 and a portion of the first capping film C1 may be removed to expose the upper surfaces of the first lower cell upper electrode 140 and the second lower cell upper electrode 240.

Figure 19:
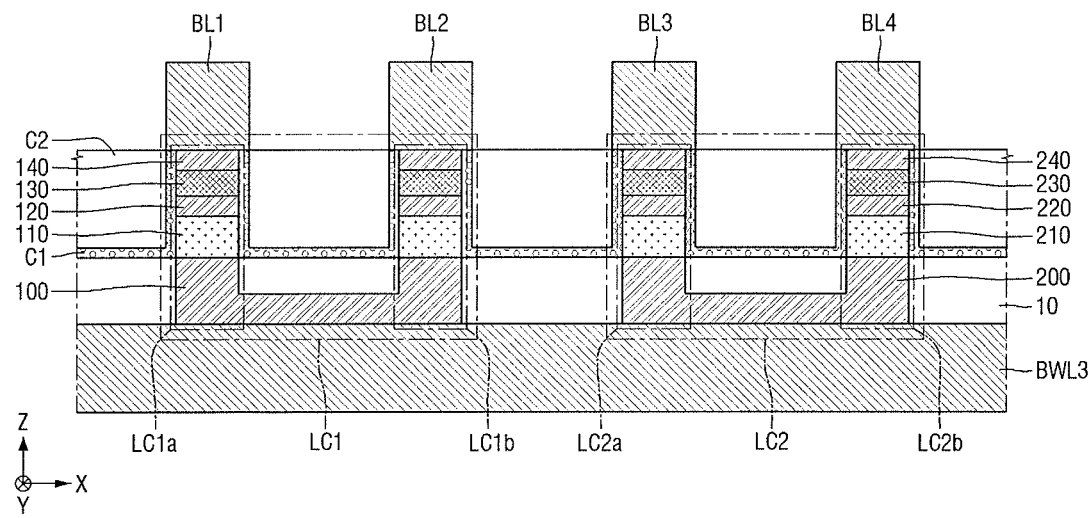

Referring to FIG. 19, the first to fourth bit lines BL1 to BL4 are formed. The first to fourth bit lines BL1 to BL4 may be formed to extend in the second direction Y at positions corresponding to the first-first lower memory cell LC1a, the first-second lower memory cell LC1b, the second-first lower memory cell LC2a, and the second-second lower memory cell LC2b, respectively.

Figure 20:
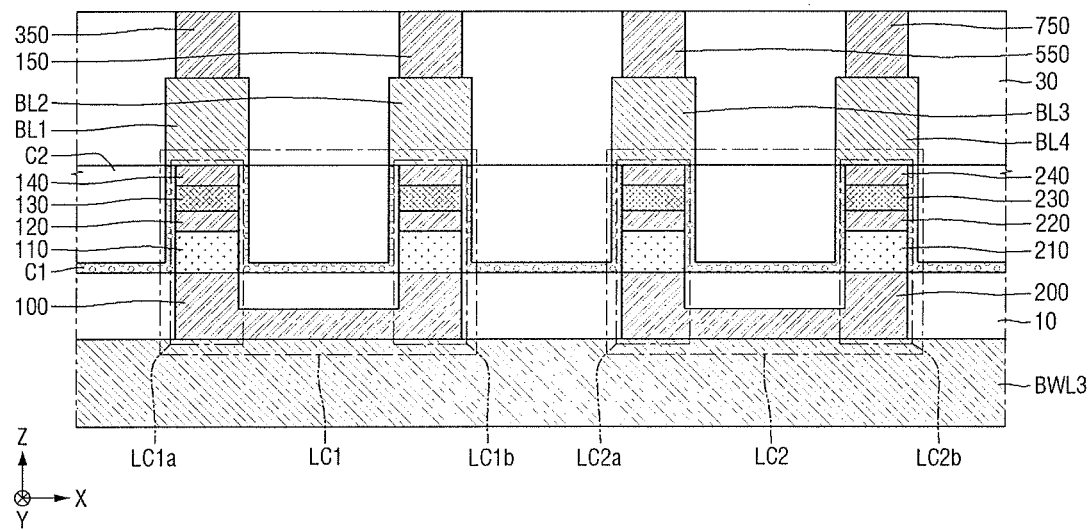

Referring to FIG. 20, the first upper cell lower electrode 150, the second upper cell lower electrode 350, the fifth upper cell lower electrode 550, and the seventh upper cell lower electrode 750 are formed. This may be the same as the formation method of the first lower cell lower electrode 100, but the extending direction may be changed from the first direction X to the second direction Y.

Figure 21:
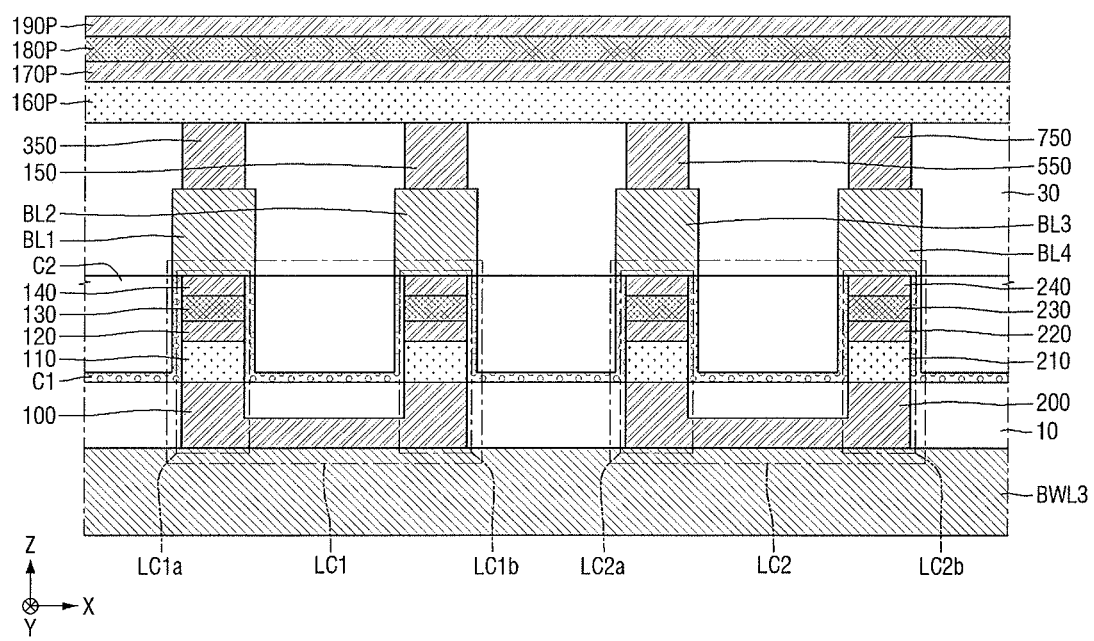

Referring to FIG. 21, an upper cell phase change memory film 160P, an upper cell intermediate electrode film 170P, an upper cell OTS film 180P, and an upper cell upper electrode film 190P are sequentially formed. The upper cell phase change memory film 160P may include a phase change material. The upper cell intermediate electrode film 170P may include a conductor. The upper cell OTS film 180P may include a chalcogen compound. The upper cell upper electrode film 190P may include a conductor.

Figure 22:
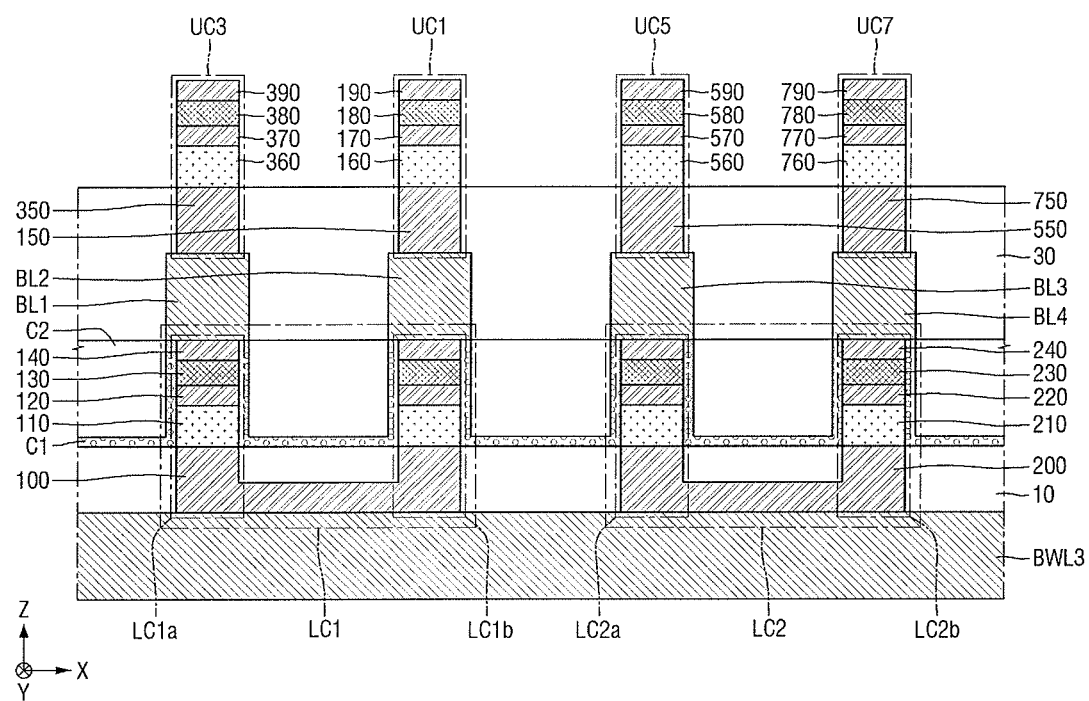

Referring to FIG. 22, the upper cell phase change memory film 160P, the upper cell intermediate electrode film 170P, the upper cell OTS film 180P, and the upper cell upper electrode film 190P are patterned to form the first upper memory cell UC1, the third upper memory cell UC3, the fifth upper memory cell UC5, and the seventh upper memory cell UC7.

The upper cell phase change memory film 160P may be patterned into the first upper cell phase change memory 160, a third upper cell phase change memory 360, a fifth upper cell phase change memory 560, and a seventh upper cell phase change memory 760. The upper cell intermediate electrode film 170P may be patterned into the first upper cell intermediate electrode 170, a third upper cell intermediate electrode 370, a fifth upper cell intermediate electrode 570, and a seventh upper cell intermediate electrode 720. The upper cell OTS film 180P may be patterned into the first upper cell OTS 180, a third upper cell OTS 380, a fifth upper cell OTS 580, and a seventh upper cell OTS 780. The upper cell upper electrode film 190P may be patterned into a first upper cell upper electrode 190, a third upper cell upper electrode 390, a fifth upper cell upper electrode 590, and a seventh upper cell upper electrode 790.

The method for forming the first upper memory cell UC1, the third upper memory cell UC3, the fifth upper memory cell UC5, and the seventh upper memory cell UC7 as described above may also apply to the second upper memory cell UC2, the fourth upper memory cell UC4, the sixth upper memory cell UC6, and the eighth upper memory cell UC8.

Figure 23:
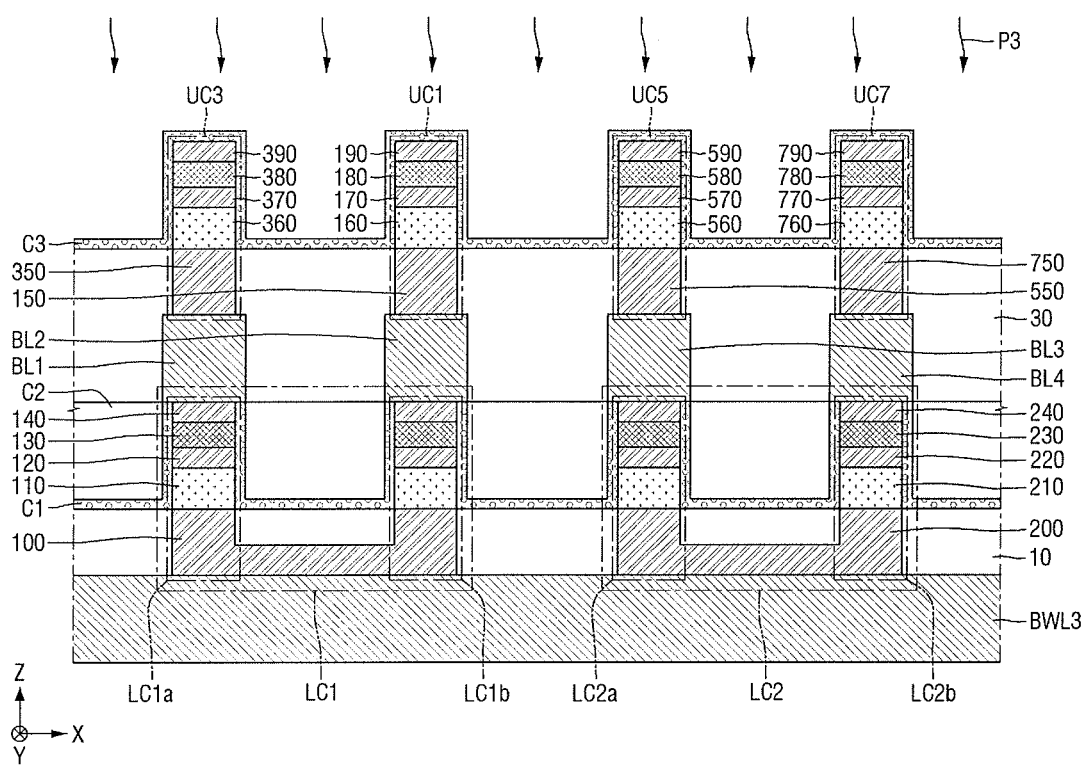

Referring to FIG. 23, the third capping film C3 is formed. Similarly to the first capping film C1, the third capping film C3 may be formed in a relatively low temperature process to protect the OTS. Formation of the third capping film C3 may use a third plasma P3, e.g., $N_2$ plasma.

Figure 24:
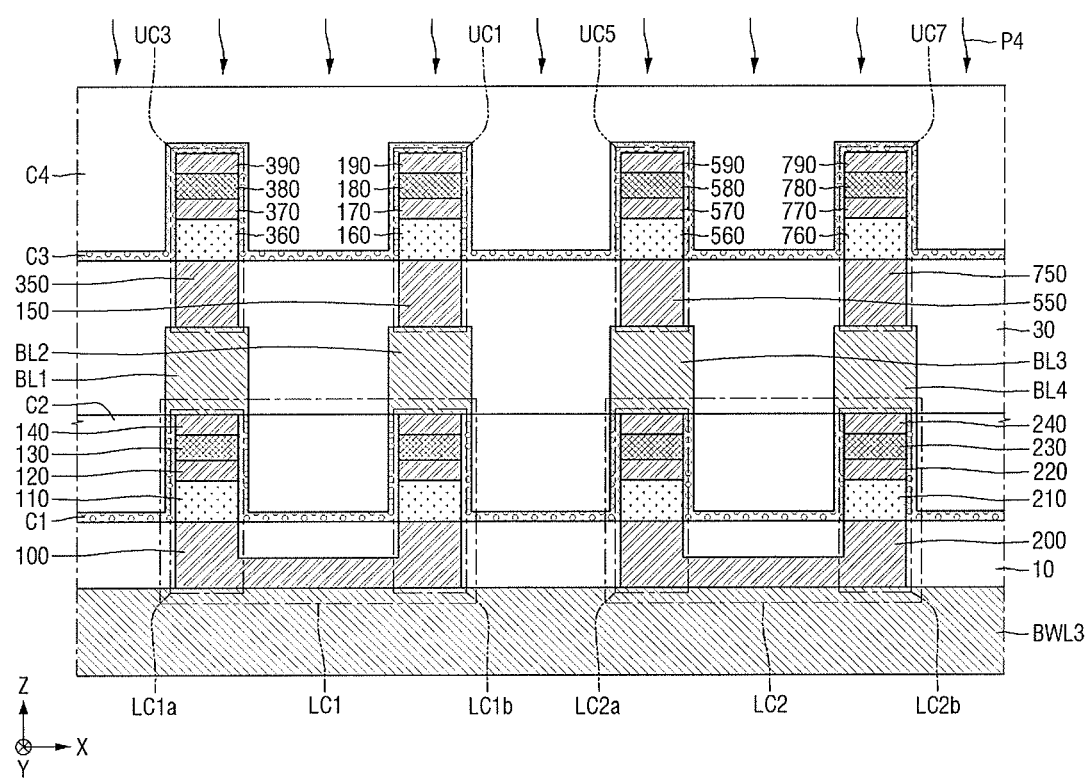

Referring to FIG. 24, the fourth capping film C4 is formed. Similarly to the second capping film C2, the fourth capping film C4 is formed in a relatively high temperature process to protect the OTS. Formation of the fourth capping film C4 may use a fourth plasma P4, e.g., $N_2$ plasma and an $NH_3$ plasma.

Figure 25:
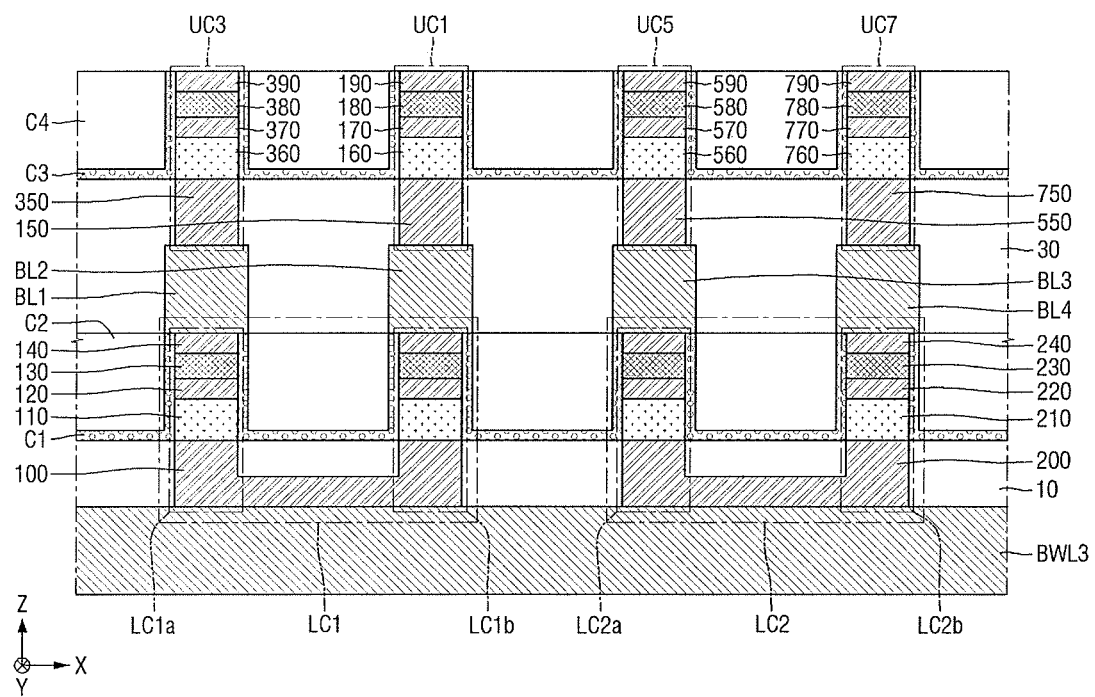

Referring to FIG. 25, a portion of the third capping film C3 and a portion of the fourth capping film C4 may be removed to expose the upper surfaces of the first upper cell upper electrode 190, the third upper cell upper electrode 390, the fifth upper cell upper electrode 590, and the seventh upper cell upper electrode 790.

Figure 26:
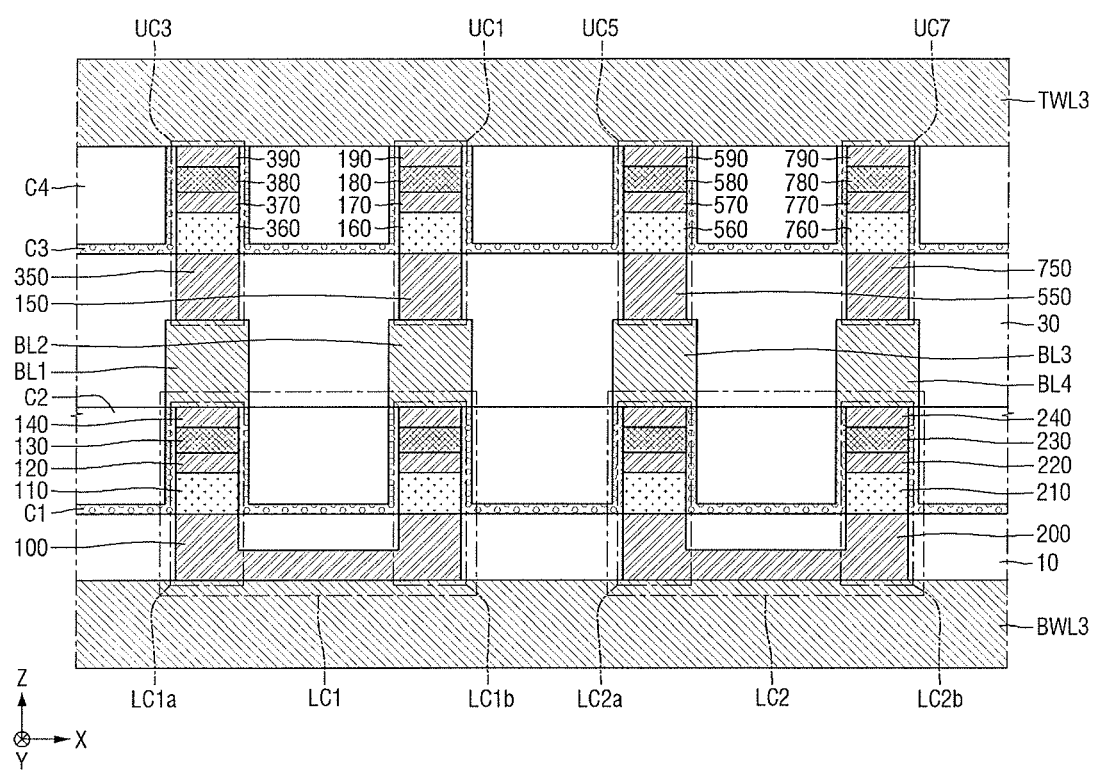

Referring to FIG. 26, the third upper word line TWL3 is formed. The third upper word line TWL3 may extend in the first direction X and may be in contact with the upper surfaces of the first upper cell upper electrode 190, the third upper cell upper electrode 390, the fifth upper cell upper electrode 590, and the seventh upper cell upper electrode 790.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A method for fabricating a semiconductor device, the method comprising:
    forming a lower electrode and a molding film surrounding the lower electrode, the molding film including SiN;
    forming a first memory cell extending in a first direction and including a phase change memory,
    an ovonic threshold switch (OTS) and an upper electrode, the phase change memory and the OTS being disposed between the lower electrode and the upper electrode;
    forming a first capping film at a first temperature, the first capping film extending along sidewalls of the phase change memory, sidewalls of the OTS, sidewalls of the upper electrode, and an upper surface of the upper electrode;
    forming a second capping film directly on the first capping film at a second temperature higher than the first temperature; and
    removing a portion of the second capping film and a portion of the first capping film to expose the upper surface of the upper electrode,
    wherein each of the first and second capping films includes a nitride-based insulating material;
    wherein the first capping film is formed through a first plasma process using a N2 gas without a NH3 gas and the second capping film is formed through a second plasma process using a NH3 gas, and the second plasma process includes:
    performing a first sub plasma process using a N2 gas; and
    performing a second sub plasma process using the NH3 gas after the first sub plasma process.

2. The method of claim 1, wherein forming the second capping film proceeds in-situ in succession to forming the first capping film.

3. The method of claim 1, wherein:
    forming the first capping film includes a dose operation, a first purge operation, a radio frequency (RF) plasma operation, and a second purge operation which are performed successively, and
    the RF plasma operation uses the first N2 plasma.

4. The method of claim 1, wherein:
    forming o the second capping film includes a dose operation, a first purge operation, a radio frequency (RF) plasma operation, a $NH_3$ processing operation, and a second purge operation which are performed successively,
    the RF plasma operation uses the second N2 plasma, and the $NH_3$ processing operation uses the $NH_3$ plasma.

5. The method of claim 1, further comprising:
    forming a second memory cell extending in the first direction and including a second phase change memory and a second OTS while the first memory cell is formed,
    wherein the second memory cell is spaced apart from the first memory cell in a second direction intersecting the first direction,
    wherein the first capping film is continuous in the first direction along the sidewalls of the first memory cell and sidewalls of the second memory cell, and in the second direction between the sidewalls of the first and second memory cells, and
    wherein the second capping film entirely fills a space between the first and second memory cells.

6. The method of claim 1, wherein each of the first and second capping films includes at least one of SiN, SiON, SiCN, and SiBN.

7. The method of claim 1, wherein the first capping film extends continuously between an upper surface of the mold film and a bottom surface of the second capping film.

* * * * *